（12） United States Patent
Messier et al.

(10) Patent No.: US 11,940,470 B2
(45) Date of Patent: Mar. 26, 2024

(54) CURRENT SENSOR SYSTEM

(71) Applicant: Allegro MicroSystems, LLC, Manchester, NH (US)

(72) Inventors: Loïc André Messier, Vanzy (FR); Simon E. Rock, Heidelberg (DE); Yannick Vuillermet, Voglans (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/804,654

(22) Filed: May 31, 2022

(65) Prior Publication Data
US 2023/0384352 A1   Nov. 30, 2023

(51) Int. Cl.
*G01R 15/20* (2006.01)
*H02K 11/27* (2016.01)

(52) U.S. Cl.
CPC .......... *G01R 15/207* (2013.01); *H02K 11/27* (2016.01); *H02K 2211/03* (2013.01)

(58) Field of Classification Search
CPC .............................. G01R 15/207; H02K 11/27
See application file for complete search history.

(56) References Cited

U.S. PATENT DOCUMENTS

| | | | |
|---|---|---|---|
| 4,757,420 A | 7/1988 | Saletta et al. | |
| 5,041,780 A | 8/1991 | Rippel | |
| 6,300,617 B1 | 10/2001 | Daughton et al. | |
| 6,356,068 B1 | 3/2002 | Steiner et al. | |
| 6,512,359 B1 | 1/2003 | Tamai et al. | |
| 6,583,613 B1 | 6/2003 | Hohe et al. | |
| 7,476,816 B2 | 1/2009 | Doogue et al. | |
| 7,598,601 B2 | 10/2009 | Taylor et al. | |
| 7,746,056 B2 | 6/2010 | Stauth et al. | |
| 7,816,905 B2 | 10/2010 | Doogue et al. | |
| 7,923,996 B2 | 4/2011 | Doogue et al. | |
| 7,936,164 B2 | 5/2011 | Doogue et al. | |
| 8,030,918 B2 | 10/2011 | Doogue et al. | |
| 8,080,994 B2 | 12/2011 | Taylor et al. | |
| 8,447,556 B2 | 5/2013 | Friedrich et al. | |
| 8,542,010 B2 | 9/2013 | Cesaretti et al. | |

(Continued)

FOREIGN PATENT DOCUMENTS

| CN | 112649645 A | 4/2021 |
|---|---|---|
| GB | 2547732 | 8/2017 |
| WO | WO 2017/144715 A1 | 8/2017 |

OTHER PUBLICATIONS

Response to Office Action dated Sep. 14, 2022, filed on Nov. 1, 2022 for U.S. Appl. No. 17/467,713; 13 pages.

(Continued)

*Primary Examiner* — Dominic E Hawkins
(74) *Attorney, Agent, or Firm* — Daly, Crowley, Mofford & Durkee, LLP

(57) ABSTRACT

A substrate, comprising one or more first conductive layers, one or more second conductive layers, and a dielectric material that is arranged to encapsulate, at least in part, the first conductive layers and the second conductive layers. The one or more second conductive layers are electrically coupled to the first conductive layers. The first conductive layers and the second conductive layers are arranged to form a conductor. The first conductive layers are arranged to define a first rift in the conductor.

28 Claims, 20 Drawing Sheets

(56) References Cited

U.S. PATENT DOCUMENTS

| | | | |
|---|---|---|---|
| 8,680,846 | B2 | 3/2014 | Cesaretti et al. |
| 8,692,546 | B2 | 4/2014 | Cesaretti et al. |
| 8,818,749 | B2 | 8/2014 | Friedrich et al. |
| 8,847,590 | B2 | 9/2014 | Flock et al. |
| 8,896,295 | B2 | 11/2014 | Friedrich et al. |
| 8,907,669 | B2 | 12/2014 | Petrie |
| 9,081,041 | B2 | 7/2015 | Friedrich et al. |
| 9,151,807 | B2 | 10/2015 | Friedrich et al. |
| 9,201,122 | B2 | 12/2015 | Cesaretti et al. |
| 9,299,915 | B2 | 3/2016 | Milano et al. |
| 9,411,025 | B2 | 8/2016 | David et al. |
| 9,620,705 | B2 | 4/2017 | Milano et al. |
| 10,333,055 | B2 | 6/2019 | Milano et al. |
| 10,345,343 | B2 | 7/2019 | Milano et al. |
| 10,481,181 | B2 | 11/2019 | Bussing et al. |
| 10,761,120 | B2 | 9/2020 | Feucht et al. |
| 10,884,031 | B2 | 1/2021 | Vuillermet et al. |
| 10,908,190 | B2 | 2/2021 | Bussing et al. |
| 11,047,884 | B2 * | 6/2021 | Shimizu ............ G01R 19/0092 |
| 11,150,273 | B2 | 10/2021 | Liu et al. |
| 11,226,382 | B2 | 1/2022 | Augendre et al. |
| 11,320,466 | B1 | 5/2022 | Briano et al. |
| 11,395,402 | B2 | 7/2022 | Sutono |
| 2007/0279053 | A1 | 12/2007 | Taylor et al. |
| 2008/0231255 | A1 | 9/2008 | Lepine et al. |
| 2009/0121704 | A1 | 5/2009 | Shibara |
| 2011/0270553 | A1 | 11/2011 | Ausserlechner et al. |
| 2012/0001617 | A1 | 1/2012 | Reynolds |
| 2012/0112365 | A1 | 5/2012 | Ausserlechner et al. |
| 2012/0146164 | A1 | 6/2012 | Ausserlechner |
| 2012/0253726 | A1 | 10/2012 | Xu |
| 2013/0015843 | A1 | 1/2013 | Doogue et al. |
| 2013/0135548 | A1 * | 5/2013 | Burberry ................ H01G 4/005 361/301.3 |
| 2013/0335076 | A1 | 12/2013 | Sakamoto et al. |
| 2014/0111196 | A1 * | 4/2014 | Sakai .................. G01R 15/205 324/252 |
| 2014/0266181 | A1 | 9/2014 | Milano et al. |
| 2014/0312883 | A1 | 10/2014 | Friedrich et al. |
| 2015/0204916 | A1 | 7/2015 | Akimoto et al. |
| 2015/0301149 | A1 | 10/2015 | Cesaretti et al. |
| 2015/0331079 | A1 | 11/2015 | Kolwalker et al. |
| 2015/0338444 | A1 | 11/2015 | Ivanov et al. |
| 2015/0362532 | A1 | 12/2015 | Chartouni |
| 2016/0011239 | A1 | 1/2016 | Yoon et al. |
| 2016/0274060 | A1 | 9/2016 | Deneneberg et al. |
| 2016/0282388 | A1 | 9/2016 | Milano et al. |
| 2017/0131329 | A1 | 5/2017 | Gorai et al. |
| 2017/0242058 | A1 | 8/2017 | Kawanami et al. |
| 2017/0285075 | A1 | 10/2017 | Okuyama et al. |
| 2018/0003742 | A1 * | 1/2018 | Shimizu ................ G01R 15/20 |
| 2018/0031613 | A1 | 1/2018 | Nakayama |
| 2018/0180649 | A1 | 6/2018 | Paci et al. |
| 2018/0238938 | A1 | 8/2018 | Feucht et al. |
| 2018/0321283 | A1 | 11/2018 | Sei et al. |
| 2019/0187187 | A1 | 6/2019 | Umetsu et al. |
| 2019/0212372 | A1 | 7/2019 | Bilbao De Mendizabal et al. |
| 2019/0391185 | A1 | 12/2019 | El Bacha et al. |
| 2020/0011902 | A1 | 1/2020 | Shimizu |
| 2020/0025804 | A1 | 1/2020 | Bussing et al. |
| 2020/0057097 | A1 | 2/2020 | Vuillermet et al. |
| 2020/0057120 | A1 | 2/2020 | Belin et al. |
| 2020/0132725 | A1 | 4/2020 | Krummenacher et al. |
| 2021/0080489 | A1 | 3/2021 | Koizumi |
| 2021/0242353 | A1 * | 8/2021 | Kim ................ H01L 21/76898 |
| 2021/0285794 | A1 | 9/2021 | Briano et al. |

OTHER PUBLICATIONS

Notice of Allowance dated Jan. 17, 2023 for U.S. Appl. No. 17/467,713; 11 pages.
U.S. Office Action dated Dec. 6, 2022 for U.S. Appl. No. 17/651,080, 18 pages.
U.S. Office Action dated Sep. 14, 2022 for U.S. Appl. No. 17/467,713; 19 pages.
U.S. Appl. No. 17/189,480, filed Mar. 2, 2021, Friedrich, et al.
U.S. Appl. No. 17/467,713, filed Sep. 7, 2021, Vuillermet, et al.
U.S. Appl. No. 17/651,080, filed Feb. 15, 2022, Rock, et al.
U.S. Appl. No. 17/654,254, filed Mar. 10, 2022, Boden, et al.
U.S. Appl. No. 17/657,135, filed Mar. 30, 2022, Liu, et al.
U.S. Appl. No. 17/695,193, filed Mar. 15, 2022, Messier, et al.
U.S. Appl. No. 17/804,647, filed May 31, 2022, Vuillermet, et al.
U.S. Appl. No. 17/850,152, filed Jun. 27, 2022, Vuillermet, et al.
Allegro MicroSystems datasheet "ACS37612 Coreless, High Precision, Hall-Effect Current Sensor IC with Common-Mode Field Rejection and High Bandwidth (240 kHz)", Mar. 9, 2020, 22 pages.
Allegro MicroSystems Datasheet "Busbar Geometry and Design Techniques for Coreless ACS37610 Differential Current Sensor", Jan. 6, 2021, 11 pages.
Auto Innovations "L'évolution du moteur électrique passe par une meilleure mesure de la position de son rotor", Oct. 2019, 7 pages.
Melexis Inspired Engineering; "Current Sensors Reference Design Guide"; Aug. 2016; 27 Pages.
Office Action dated Sep. 24, 2019 for U.S. Appl. No. 15/435,725; 25 pages.
Response to Office Action filed on Oct. 18, 2019 for U.S. Appl. No. 15/435,725; 13 pages.
Final Office Action dated Jan. 24, 2020 for U.S. Appl. No. 15/435,725; 25 pages.
Response to Final Office Action and Request for Continued Examination (RCE) filed on Mar. 31, 2020 for U.S. Appl. No. 15/435,725; 14 pages.
Notice of Allowance dated Jun. 9, 2020 for U.S. Appl. No. 15/435,725; 8 pages.
Extended European Search Report dated Jul. 10, 2018 for EP Application No. 18154879.3; 10 Pages.
Response filed on Feb. 22, 2019 for European Application No. 18154879.3; 20 Pages.
Intention to Grant dated Jun. 7, 2019 for European Application No. 18154879.3; 7 Pages.
Office Action dated Jul. 6, 2020 for U.S. Appl. No. 15/999,122; 18 pages.
Office Action dated May 11, 2021 for U.S. Appl. No. 16/841,853, 18 pages.
Response to Office Action filed on Jul. 28, 2021 for U.S. Appl. No. 16/841,853, 12 pages.
Notice of Allowance dated Oct. 28, 2021 for U.S. Appl. No. 16/841,853, 9 pages.
Response to U.S. Office Action dated Dec. 6, 2022 filed on Mar. 6, 2023 for U.S. Appl. No. 17/651,080, 13 pages.
Infineon Datasheet, "TLE4972-AE35D5 high precision coreless current sensor for automotive applications", Dec. 21, 2021, 20 pages.
Infineon Datasheet, "TLE4972-AE35S5 high precision coreless current sensor for automotive applications", Dec. 21, 2021, 20 pages.
Notice of Allowance dated Jul. 21, 2023 for U.S. Appl. No. 17/651,080, 10 pages.
Notice of Allowance dated Sep. 13, 2023 for U.S. Appl. No. 17/651,080, 10 pages.
U.S. Appl. No. 18/300,776, filed Apr. 14, 2023, Vuillermet, et al.
PCT Search Report and Written Opinion dated Oct. 31, 2022 for PCT Application No. PCT/US2022/038329; 12 pages.

* cited by examiner

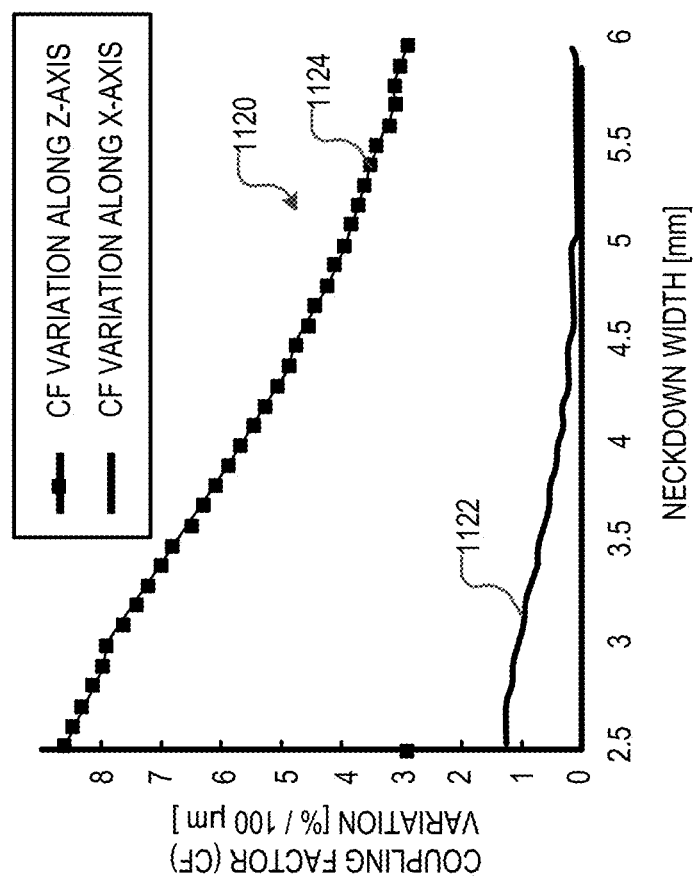
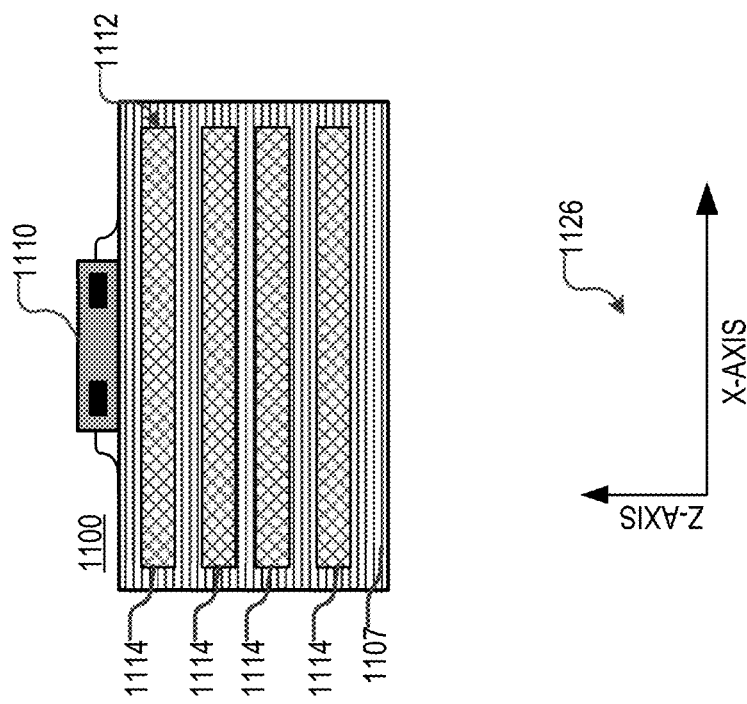
FIG. 11

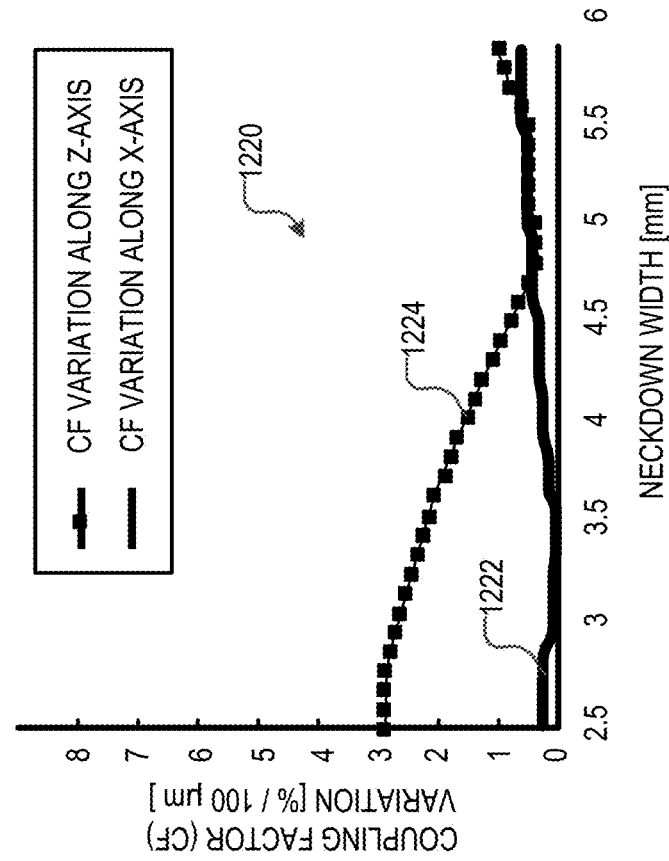
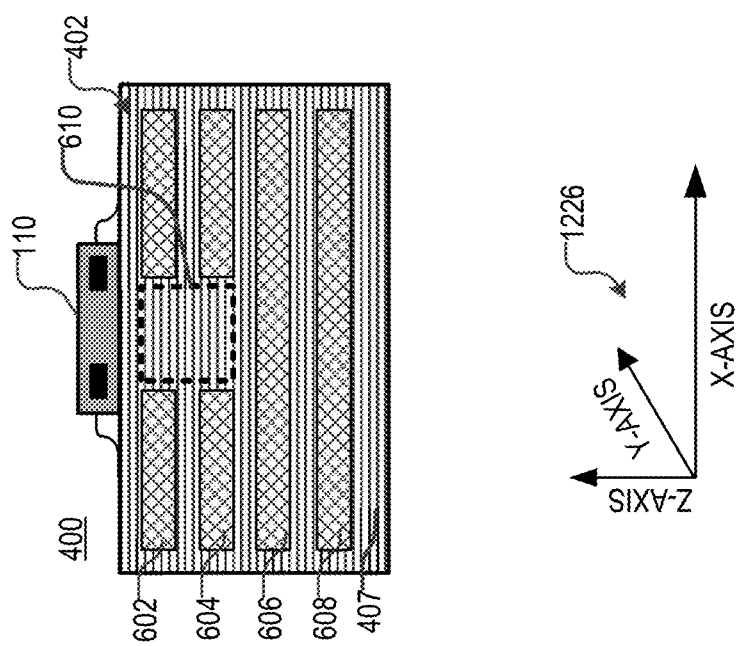
FIG. 12

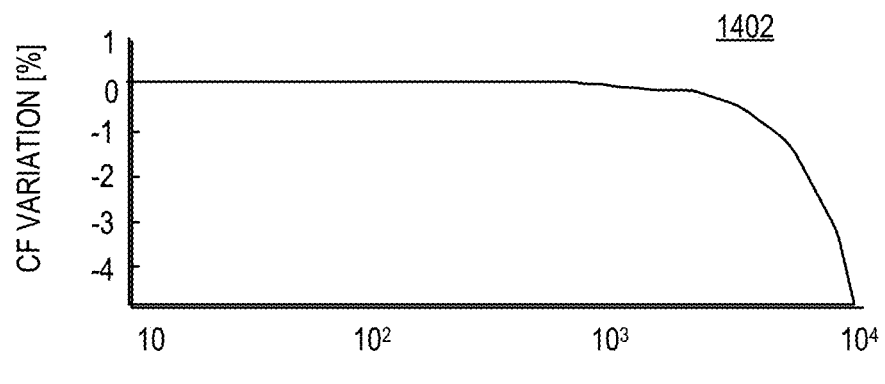
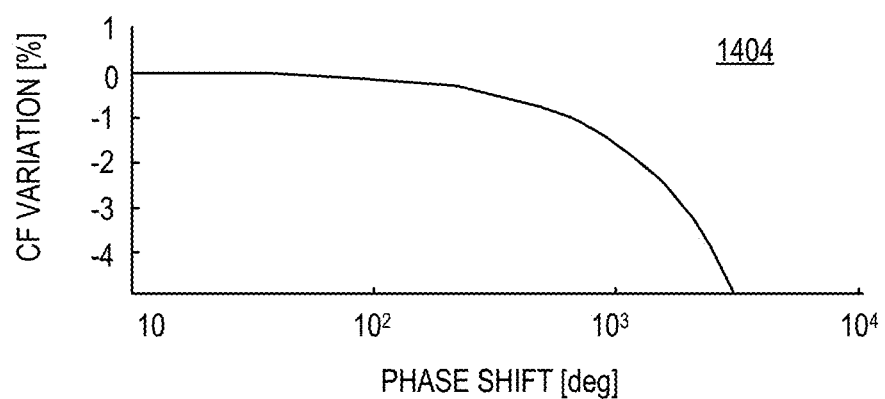
FIG. 14

CURRENT SENSOR SYSTEM

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a substrate is provided, comprising: one or more first conductive layers; one or more second conductive layers that are electrically coupled to the first conductive layers, the first conductive layers and the second conductive layers being arranged to form a conductor, the first conductive layers being arranged to define a first rift in the conductor; and a dielectric material that is arranged to encapsulate, at least in part, the first conductive layers and the second conductive layers.

According to aspects of the disclosure, a system is provided, comprising: one or more first conductive layers; one or more second conductive layers that are electrically coupled to the first conductive layers, the first conductive layers and the second conductive layers being arranged to form a conductor, the first conductive layers being configured to define a first rift in the conductor; and a first current sensor that is mounted above the first rift.

According to aspects of the disclosure, a substrate is provided, comprising: a plurality of conductors, each of the plurality of conductors including one or more first conductive layers and one or more second conductive layers that are electrically coupled to the first conductive layers, the first conductive layers in any of the plurality of conductors being configured to define a respective rift in the conductor; and a dielectric material that is arranged to encapsulate, at least in part, the plurality of conductors, wherein the respective rift in any of the plurality of conductors is arranged to cause an area directly above the respective rift to have a substantially uniform magnetic coupling coefficient.

According to aspects of the disclosure, a system is provided, comprising: a plurality of conductors, each of the plurality of conductors including one or more first conductive layers and one or more second conductive layers that are electrically coupled to the first conductive layers, the first conductive layers in any of the plurality of conductors being configured to define a respective rift in the conductor; and a plurality of current sensors, wherein each of the current sensors is disposed over the respective rift in a different one of the plurality of conductors, wherein the respective rift in any of the plurality of conductors is arranged to cause an area over the respective rift to have a substantially uniform magnetic coupling coefficient.

BRIEF DESCRIPTION OF THE DRAWINGS

The foregoing features may be more fully understood from the following description of the drawings in which:

FIG. 11 is a diagram illustrating aspects of the operation of a system, according to aspects of the disclosure;

FIG. 12 is a diagram illustrating aspects of the operation of a system, according to aspects of the disclosure;

FIG. 14 shows plots illustrating aspects of the operation of a system, according to aspects of the disclosure.

DETAILED DESCRIPTION

Figure 1:
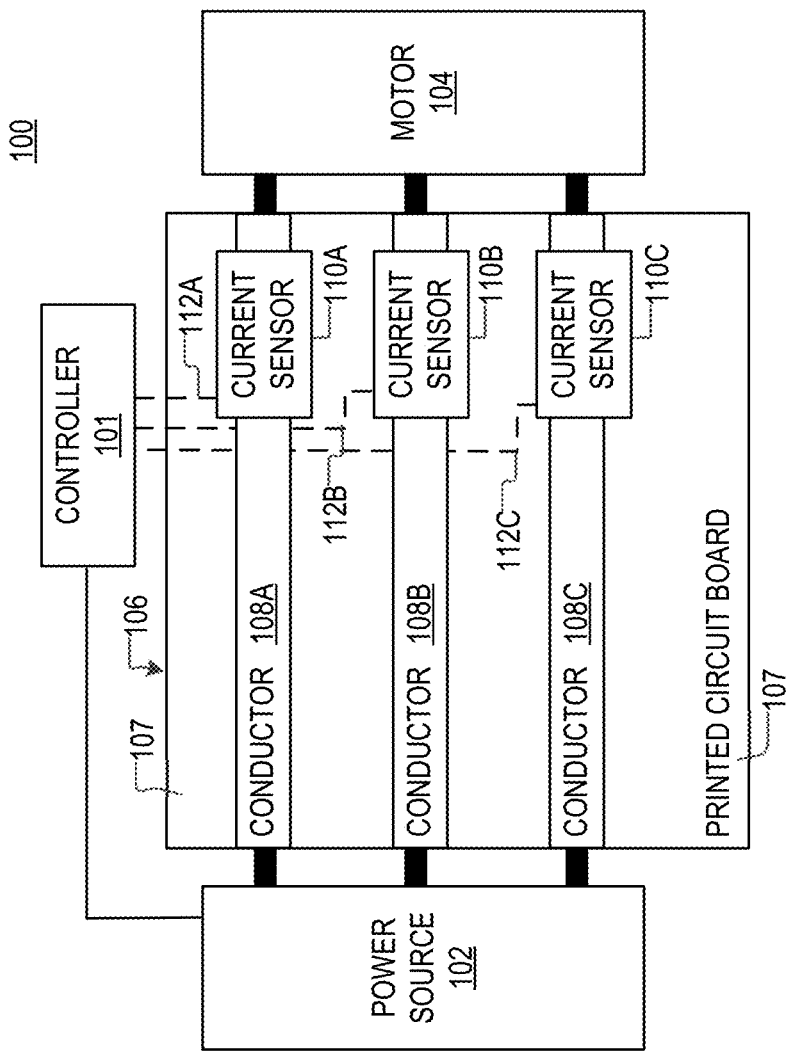
FIG. 1 is a diagram of an example of a system, according to aspects of the disclosure.

FIG. 1 is a diagram of an example of a system 100, according to aspects of the disclosure. As illustrated, the system 100 may include a controller 101 and a power source 102 that is coupled to an electric motor 104 via an interface 106.

The interface 106 may include a printed circuit board (PCB) 107. The PCB 107 may include conductors 108A-C and conductive traces 112A-C. Each of the conductive traces 112A-C may include one or more metal layers (or layers of another conductive material) that are at least partially encapsulated in a dielectric material of the PCB 107. Each of the conductors 108A-C may also include one or more metal layers (or layers of another conductive material) that are at least partially encapsulated in the dielectric material of the PCB 107. In some implementations, the conductive traces 112A-C may differ in one or more characteristics from the conductors 108A-C. According to the example of FIG. 1, each of the conductors 108A-C may be configured to carry higher currents than any of the conductive traces 112A-C. Additionally or alternatively, in some implementations, each of the conductors 108A-C may have a larger cross-section than any of the conductive traces 112A-C. Additionally or alternatively, in some implementations, each of the conductors 108A-C may have larger width and/or thickness than any of the conductive traces 112A-C.

Each of the conductors 108A-C may be used to deliver, to the electric motor 104, current that is supplied by the power source 102. The controller 101 may be coupled to the current sensors 110A-C via the conductive traces 112A-C. The controller 101 may use the current sensors 110A-C to measure the level of the current that is being supplied by the power source 102 to the electric motor 104 and make adjustments to the operation of the power source 102 and/or the electric motor 104 in response to the measurements. Specifically, the controller 101 may use current sensor 110A to measure the current carried by conductor 108A, current sensor 110B to measure current carried by conductor 108B, and current sensor 110C to measure current carried by conductor 108C. Although in the example of FIG. 1 the interface 106 consists of three conductors 108, alternative implementations are possible in which the interface 106 consists of any number of conductors 108 (e.g., only one conductor, only two conductors, five conductors, etc.). Although in the example of FIG. 1 the interface 106 is used to electrically couple a motor to a power source, it will be understood that the present disclosure is not limited to any specific application of the interface 106.

In some implementations, any of conductors 108A-C may have a width between 8 mm and 30 mm, whereas each of the conductive traces 112A-C may have a width between 0.1 mm and 1 mm. Moreover, each of the conductors 108A-C may include 2 or more layers (e.g., 2-10 layers, etc.), each having thickness between 20 μm to 200 μm. As can be readily appreciated that conductors 108A-C may be adapted to carry much higher currents than the conductive traces 112A-C. By way of example, in some implementations, each of conductors 108A-C may be configured to carry current in the range of 50-500 A, whereas each of the conductive traces may be configured to carry current in the range of 0.01 A-5 A. As noted above, in some implementations, both the conductors 108A-C and the conductive traces 112A-C may be embedded in the PCB 107. In some implementations, both the conductors 108A-C and the conductive traces 112A-C may be formed by using standard lithographic techniques that are normally applied in PCB manufacturing. In some implementations, any of the conductors 108A, 108B, and 108C may be the same or similar to any of the implementations of the conductor 402, which are discussed further below with respect to FIGS. 4-10E and 15. Additionally or alternatively, in some implementations, the PCB 107 may be the same or similar to the PCB 407, which is discussed further below with respect to FIGS. 4-10E and 15.

Figure 2:
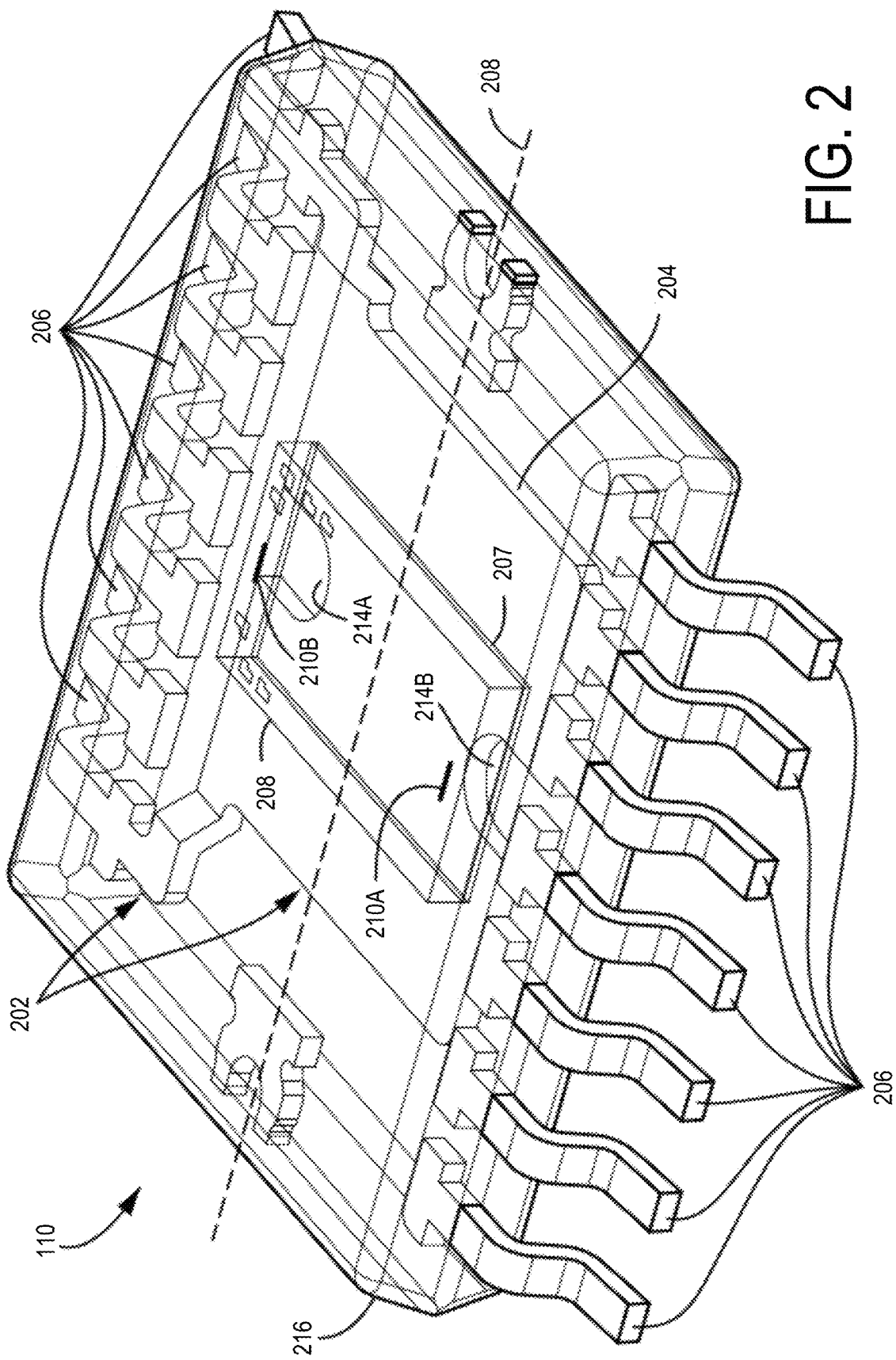
FIG. 2 is a diagram of an example of a current sensor, according to aspects of the disclosure.

FIG. 2 is a diagram of an example of a current sensor 110, according to aspects of the disclosure. As the numbering suggests, the current sensor 110 may be the same or similar to any of the current sensors 110A-C, which are shown in FIG. 1. It will be understood that FIG. 2 is provided as an example only, and the interface 106 is not limited to using any specific type of current sensor.

Features of current sensor 110 include a lead frame 202 and a die 208 supporting magnetic field sensing elements 210A and 210B. Lead frame 202 includes a die attach paddle 204 and a plurality of leads 206. Die 208 is attached to die attach paddle 204, as may be achieved with an adhesive layer 207. While a single semiconductor die 208 is shown, the current sensor 110 can include more than one die, with each such die supporting magnetic field sensing element(s) and/or supporting circuitry. Additional features of the example current sensor 110 can include one or more cutouts, slits, slots or apertures 214A, 214B in the paddle 204 to reduce eddy currents and mold material 216 to enclose die attach paddle 204, die 208, magnetic field sensing elements 210A and 210B and portions of leads 206, shown. Aspects of current sensor 110 are shown and described in U.S. Pat. No. 10,481,181, entitled "Systems and Methods For Current Sensing" and issued on Nov. 19, 2019, which patent is hereby incorporated herein by reference in its entirety. In use, current sensor 110 is configured to be positioned proximate to a conductor, such as any of the conductors 108A-C, which are shown in the configuration of FIG. 1. Although in the example of FIG. 2, the sensor 110 includes two magnetic field sensing elements, alternative implementations are possible in which the sensor 110 includes only one magnetic field sensing element or more than two magnetic field sensing elements.

Figure 3:
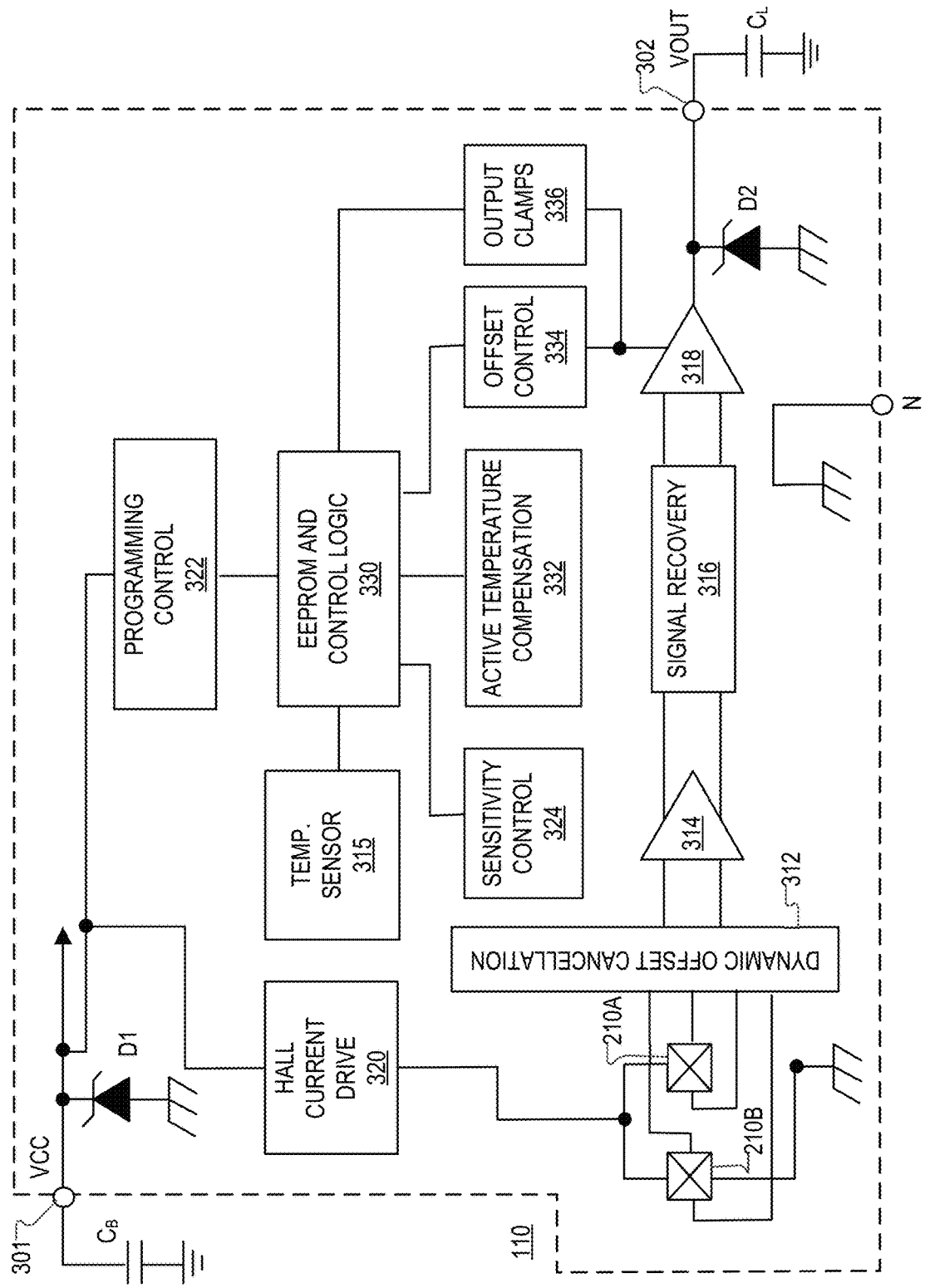
FIG. 3 is a circuit diagram of an example of a current sensor, according to aspects of the disclosure.

FIG. 3 is a circuit diagram illustrating one possible implementation of the electronic circuitry of the sensor 110.

The sensor 110 may be configured to output a signal VOUT that is proportional to $\Delta B = B_R - B_L$ where $B_R$ represents magnetic field incident on one of the magnetic field sensing elements 210A-B and $B_L$ represents magnetic field incident on the other one of the magnetic field sensing elements 210A-B. The sensor output VOUT is also affected by the sensitivity, $\alpha$, of the signal path and can be represented as follows:

$$VOUT = \alpha \times \Delta B \quad (1)$$

The relationship between the conductor current to be measured and the differential field $\Delta B$ can be represented by a coupling coefficient, K(f) as follows:

$$\Delta B = K(f) \times I \quad (2)$$

It will be appreciated that coupling coefficient K(f) corresponds to coupling (e.g., transfer of energy, etc.) between a given current sensor and varies with frequency. As is discussed further below, the design of the conductors 108A-C helps reduce the variation of the coupling coefficient K(f) with respect to the frequency of the current that is being transmitted over conductors 108A-C. Throughout the disclosure the terms "coupling coefficient" and "coupling factor" are used interchangeably.

The sensor 110 may include a VCC (supply voltage) pin 301, a VOUT (output signal) pin 302. The VCC pin 301 is used for the input power supply or supply voltage for the current sensor 110. A bypass capacitor, $C_B$, can be coupled between the VCC pin 301 and ground. The VCC pin 301 can also be used for programming the current sensor 110. The VOUT pin 302 is used for providing the output signal VOUT to circuits and systems (not shown) such as controller 101 (FIG. 1) and can also be used for programming. An output load capacitance $C_L$ is coupled between the VOUT pin 302 and ground. The example current sensor 110 can include a first diode D1 coupled between the VCC pin 301 and chassis ground and a second diode D2 coupled between the VOUT pin 302 and chassis ground.

The driver circuit 320 may be configured to drive the magnetic field sensing elements 210A and 210B. Magnetic field signals generated by the magnetic field sensing elements 210A and 210B are coupled to a dynamic offset cancellation circuit 312, which is further coupled to an amplifier 314. The amplifier 314 is configured to generate an amplified signal for coupling to the signal recovery circuit 316. Dynamic offset cancellation circuit 312 may take various forms including chopping circuitry and may function in conjunction with offset control circuit 334 to remove offset that can be associated with the magnetic field sensing elements 210A-B and/or the amplifier 314. For example, offset cancellation circuit 312 can include switches configurable to drive the magnetic field sensing elements (e.g., Hall plates) in two or more different directions such that selected drive and signal contact pairs are interchanged during each phase of the chopping clock signal and offset voltages of the different driving arrangements tend to cancel. A regulator (not shown) can be coupled between supply voltage VCC and ground and to the various components and sub-circuits of the sensor 110 to regulate the supply voltage.

A programming control circuit 322 is coupled between the VCC pin 301 and EEPROM and control logic circuit 330 to provide appropriate control to the EEPROM and control logic circuit. EEPROM and control logic circuit 330 determines any application-specific coding and can be erased and reprogrammed using a pulsed voltage. A sensitivity control circuit 324 can be coupled to the amplifier 314 to generate and provide a sensitivity control signal to the amplifier 314 to adjust a sensitivity and/or operating voltage of the amplifier 314. An active temperature compensation circuit 332 can be coupled to sensitivity control circuit 324, EEPROM and control logic circuit 330, and offset control circuit 334. The offset control circuit 334 can generate and provide an offset signal to a push/pull driver circuit 318 (which may be an amplifier) to adjust the sensitivity and/or operating voltage of the driver circuit 318. The active temperature compensation circuit 332 can acquire temperature data from EEPROM and control logic circuit 330 via a temperature sensor 315 and perform necessary calculations to compensate for changes in temperature, if needed. Output clamps circuit 336 can be coupled between the EEPROM and control logic circuit 330 and the driver circuit 318 to limit the output voltage and for diagnostic purposes.

Figure 4:
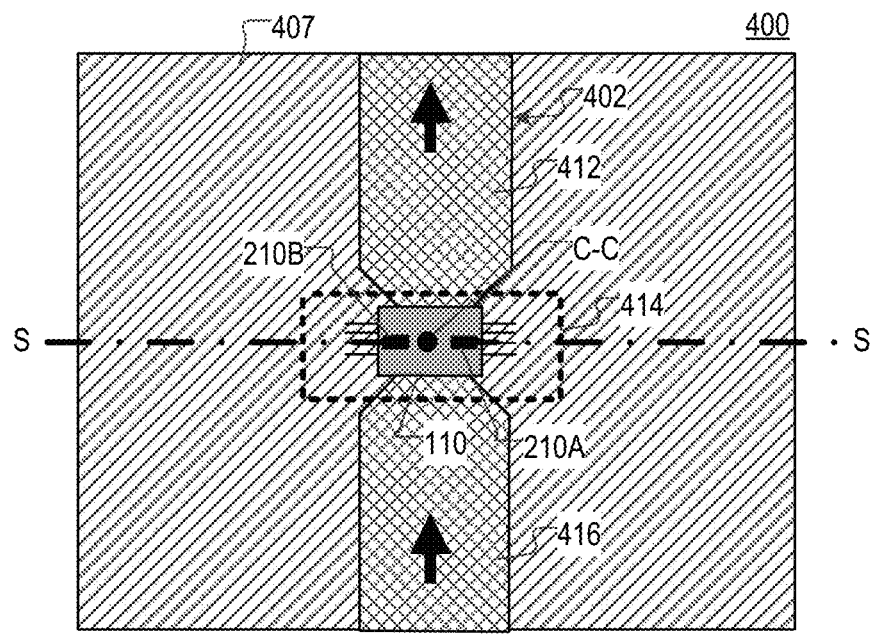
FIG. 4 is a top-down view of an example of a system, according to aspects of the disclosure.
Figure 5:
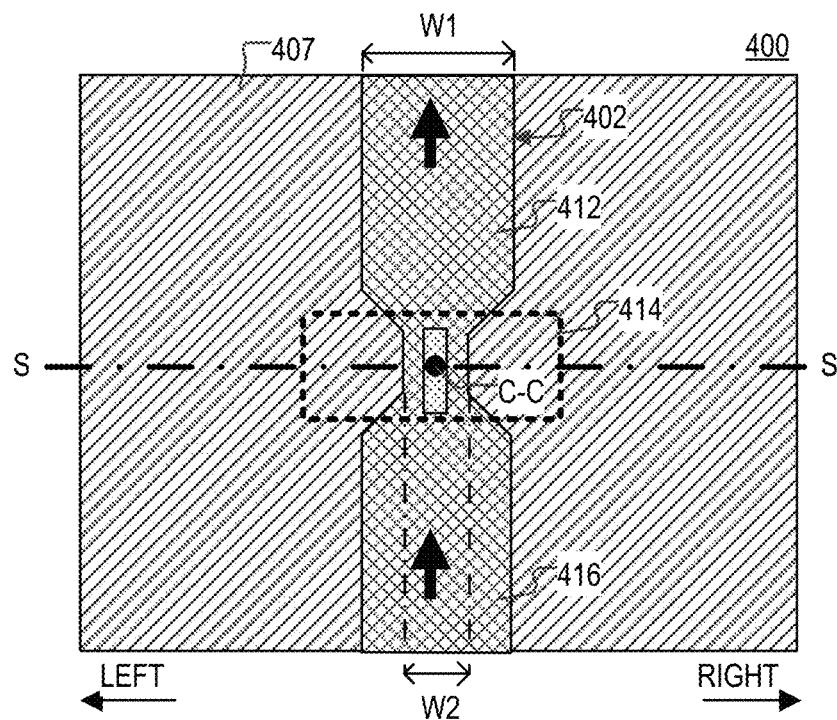
FIG. 5 is a top-down view of an example of a substrate, according to aspects of the disclosure.

FIGS. 4-5 illustrates an example of a system 400, according to aspects of the disclosure. As illustrated, the system 400 may include a conductor 402 that is part of a printed circuit board (PCB) 407 and a current sensor 110 that is mounted on the PCB 407 above the conductor 402. The conductor 402 may include side portions 412 and 416 and a middle portion 414. The side portions 412 and 416 may be formed on opposite sides of the middle portion 414. The sensor 110 may be mounted over the middle portion 414. Each of the side portions 412 and 416 may have a width W1, and the middle portion may have a width W2. The width W2 may be smaller than the width W1. Because the middle portion 414 of the conductor 402 has a smaller width than the side portions 412 and 416, under the nomenclature of the present disclosure, the middle portion 414 is also referred to as a "neckdown" of the conductor 402. Because of its reduced width, the middle portion 414 may have an increased current density and a higher magnetic coupling coefficient in comparison to the side portions 412 and 416. Placing the sensor 110 over a portion of the conductor 402 that has a higher current density, or a higher magnetic coupling coefficient, may have the advantage of increasing the accuracy of the sensor 110. The flow of current through the conductor 402 is indicated by the black arrows that are superimposed on the conductor 402 in FIGS. 4 and 5. Although in the present example the conductor 402 is provided with a neckdown, alternative implementations are possible in which the neckdown is omitted. In such implementations, the middle portion 414 of the conductor 402 may have the same width as the side portions 412 and 416. Under the nomenclature of the present disclosure, the PCB 407 including the conductor 402 is referred to as a substrate. The PCB 407 may or may not include other conductors or conductive traces.

Figure 6A:
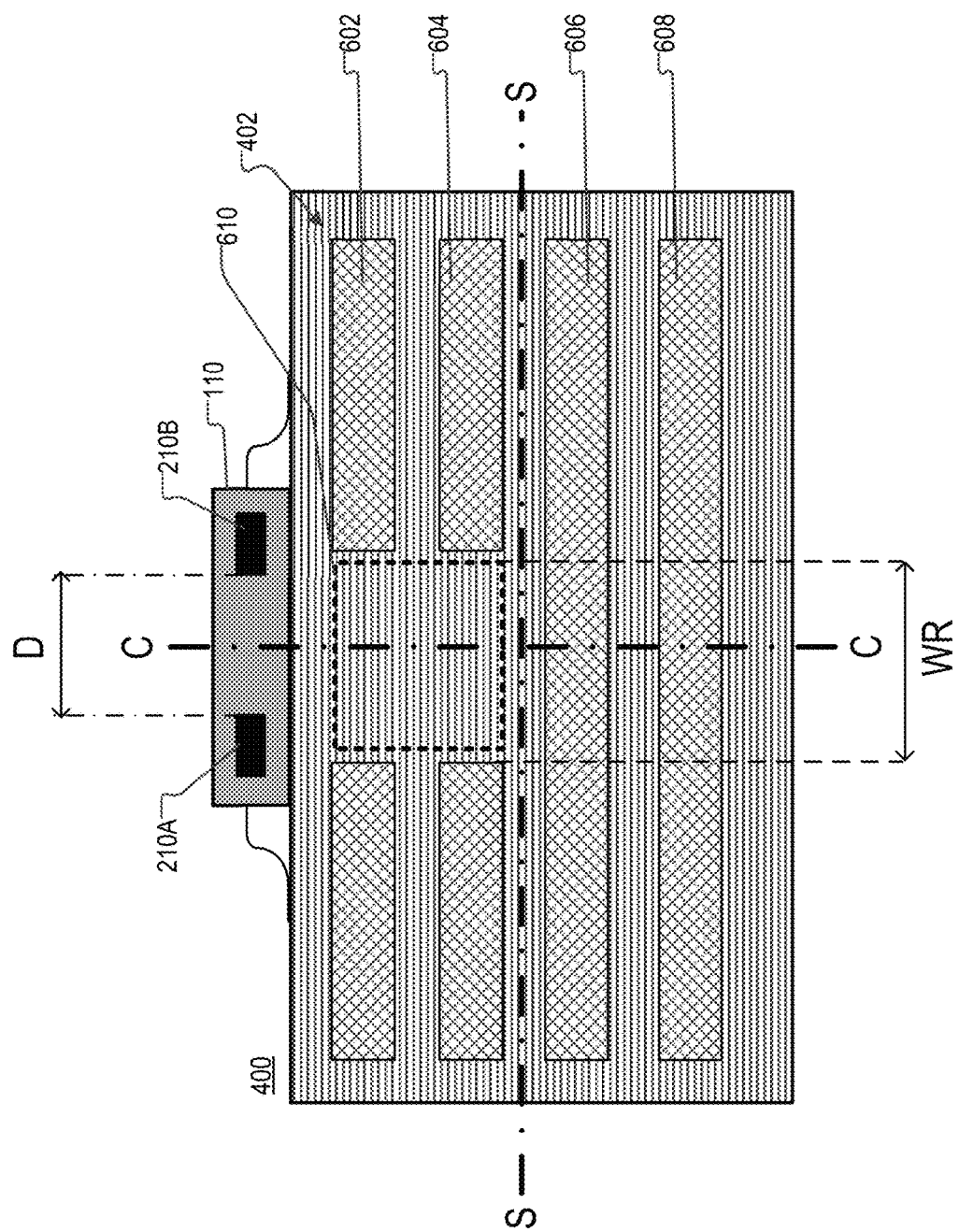
FIG. 6A is a cross-sectional side view of an example of a system, according to aspects of the disclosure.

FIG. 6A shows a cross-sectional side view of the system 400 that is taken along an axis S-S (shown in FIGS. 4-5). As illustrated, the conductor 402 may include conductive layers 602, 604, 606, and 608. The space between conductive layers 602, 604, 606, and 608 may be filled (fully or partially) with dielectric material (e.g., dielectric material that is part of the PCB 407). The conductance layers 602-608 may be formed of metal or another conductive material by using standard lithographic techniques that are used in the manufacturing of PCBs. A rift 610 may be formed in the conductor 402, as shown. The rift 610 may be a space that is bereft of any conductive material, which is situated inside the conductor 402, and which extends through at least one of the conductive layers that form the conductor 402. As is discussed further below with respect to FIGS. 6B-E, the rift 610 may be formed by aligning through-holes 621 and 641 in the conductive layers 602-604 (shown in FIGS. 6B-C). An axis C-C may run through the mid-section of the rift 610. The sensing elements 210A and 201B of the sensor 110 may be disposed on opposite sides of the axis C-C. In some implementations, the sensing element 210A may be spaced apart from the axis C-C by the same distance as the sensing element 210B. According to the example of FIG. 6A, the distance D between the magnetic field sensing elements 210A and 210B is smaller than the width WR of the rift 610. However, alternative implementations are possible in which the distance D is greater than or equal to the width WR.

Figure 6B:
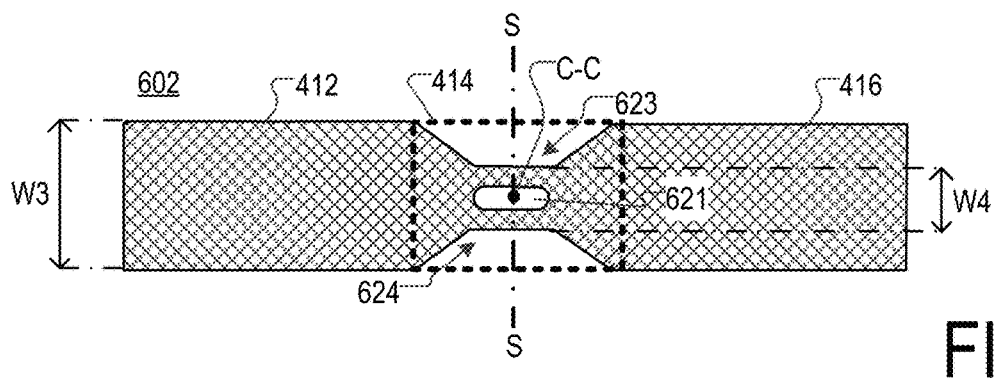
FIG. 6B is a top-down view of an example of a conductive layer, according to aspects of the disclosure.

FIG. 6B shows the conductive layer 602 in further detail. As illustrated, the conductive layer 602 may include side portions 412 and 416, as well as a middle portion 414. The middle portion 414 of the conductive layer 602 is denoted by a dashed rectangle in FIG. 6B. The middle portion 414 of the conductive layer 602 may include a through-hole 621 that is formed therein. In addition, the middle portion 414 of the conductive layer 602 may include notches 623 and 624 that are formed on opposite sides of the through-hole 621. The side portions 412 and 416 of the conductive layer 602 may have a width W3 and the middle portion 414 may have a width W4. According to the present example, the width W4 is smaller than the width W3. However, alternative implementations are possible in which the width W4 is greater than or equal to the width W3, in which case the notches 623 and 624 may be omitted.

Figure 6C:
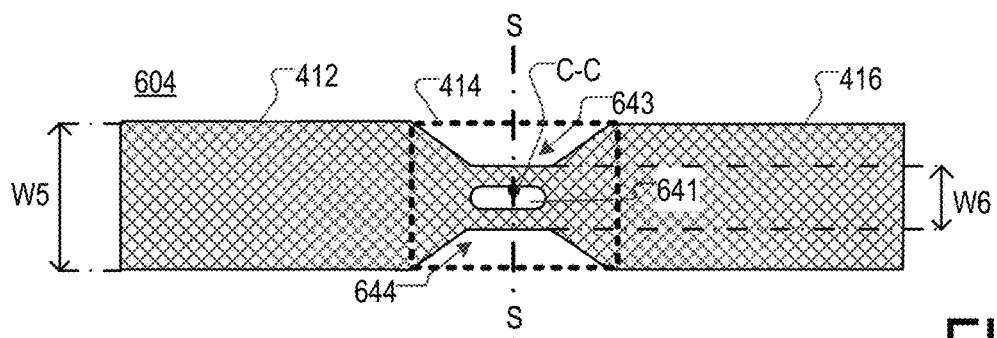
FIG. 6C is a top-down view of an example of a conductive layer, according to aspects of the disclosure.

FIG. 6C shows the conductive layer 604 in further detail. As illustrated, the conductive layer 604 may include side portions 412 and 416, as well as a middle portion 414. The middle portion 414 of the conductive layer 604 is denoted by a dashed rectangle in FIG. 6C. The middle portion 414 of the conductive layer 604 may include a through-hole 641 that is formed therein. In addition, the middle portion 414 of the conductive layer 604 may include notches 643 and 644 that are formed on opposite sides of the through-hole 641. The side portions 412 and 416 of the conductive layer 604 may have a width W5 and the middle portion 414 may have a width W6. According to the present example, the width W6 is smaller than the width W5. However, alternative implementations are possible in which the width W6 is greater than or equal to the width W5, in which case the notches 643 and 644 may be omitted.

Figure 6D:
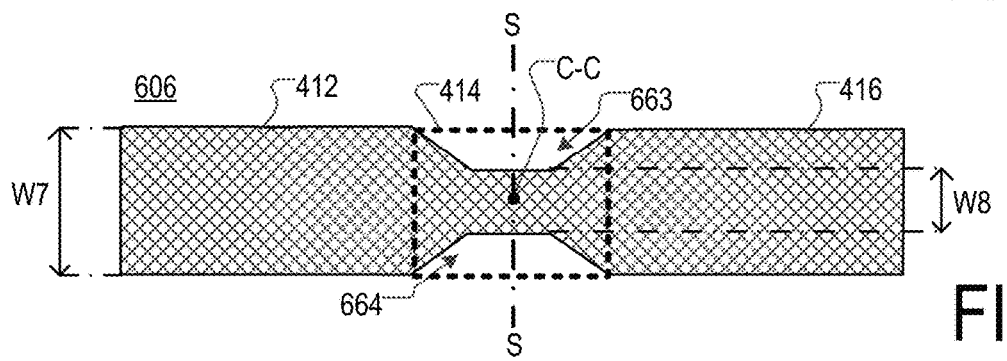
FIG. 6D is a top-down view of an example of a conductive layer, according to aspects of the disclosure.

FIG. 6D shows the conductive layer 606 in further detail. As illustrated, the conductive layer 606 may include side portions 412 and 416, as well as a middle portion 414. The middle portion 414 of the conductive layer 606 is denoted by a dashed rectangle in FIG. 6D. The middle portion 414 of the conductive layer 606 may include notches 663 and 664 that are formed on opposite sides of the conductive layer 606. The side portions 412 and 416 of the conductive layer 606 may have a width W7 and the middle portion 414 may have a width W8. According to the present example, the width W8 is smaller than the width W7. However, alternative implementations are possible in which the width W8 is greater than or equal to the width W7, in which case the notches 663 and 664 may be omitted.

Figure 6E:
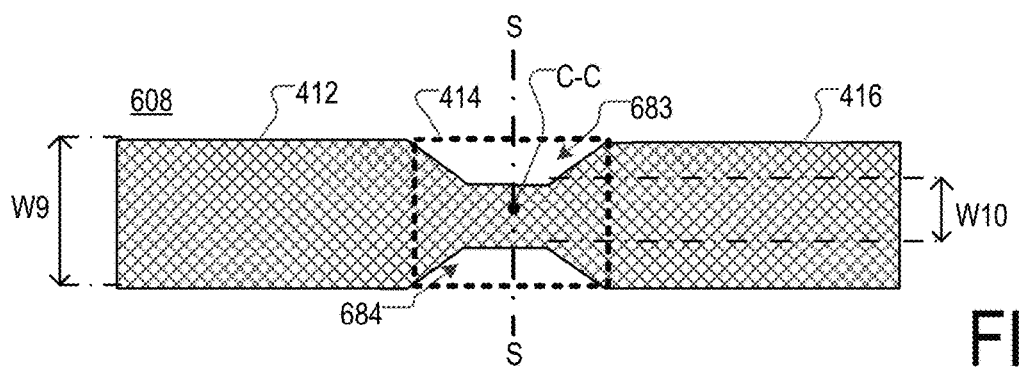
FIG. 6E is a top-down view of an example of a conductive layer, according to aspects of the disclosure.

FIG. 6E shows the conductive layer 608 in further detail. As illustrated, the conductive layer 608 may include side portions 412 and 416, as well as a middle portion 414. The middle portion 414 of the conductive layer 608 is denoted by a dashed rectangle in FIG. 6E. The middle portion 414 of the conductive layer 608 may include notches 683 and 684 that are formed on opposite sides of conductive layer 608. The side portions 412 and 416 of the conductive layer 608 may have a width W9 and the middle portion 414 may have a width W10. According to the present example, the width W10 is smaller than the width W9. However, alternative implementations are possible in which the width W10 is greater than or equal to the width W9, in which case the notches 683 and 684 may be omitted.

According to the example of FIGS. 4-6B, W1=W3=W5=W7=W9. However alternative implementations are possible in which any of the widths W3, W5, W7, and W9 is different than at least another one of the widths W3, W5, W7, and W9. In such implementations, the width W1 may be equal to the largest one of the widths W3, W5, W7, and W9 (assuming that the layers 602-608 are perfectly aligned with one another). According to the example of FIGS. 4-6B, W2=W4=W6=W8=W10. However alternative implementations are possible in which any of the widths W4, W6, W8, and W10 is different than at least another one of the widths W4, W6, W8, and W10. In such implementations, the width W2 may be equal to the largest one of the widths W4, W6, W8, and W10 (assuming that the layers 602-608 are perfectly aligned with one another).

Although in the present example each of the conductive layers 602-608 includes two notches, alternative implementations are possible in which at least one (or all) of the conductive layers 602-608 includes one notch only or no notches at all. According to the example of FIG. 6B, each of the layers 602-608 is positioned directly above the conductive layer beneath it. However, alternative implementations are possible in which any given one of the layers 602-608 is offset in the left-right direction (from axis C-C) than another one of the layers 602-608 is disposed above or below the given layer. Furthermore, alternative implementations are possible in which any of the layers 602-608 is angled relative to another one of the layers 602-608. Although in the example of FIG. 6B, the conductor 402 includes four conductive layers, alternative implementations are possible in which the conductor 402 includes any number of conductive layers (e.g., 2 layers, 5, layers, 11 layers, etc.). Although in the example of FIG. 6B the rift 610 extends through two conductive layers (i.e., layers 602 and 604), alternative implementations are possible in which the rift 610 extends through any number of layers (e.g., 1 layer, 3 layers, 7 layers, etc.) In some implementations, the rift 610 may extend through all layers of the conductor 402. In such implementations, all layers of the conductor 402 may have the same configuration as layers 602/604.

Figure 6F:
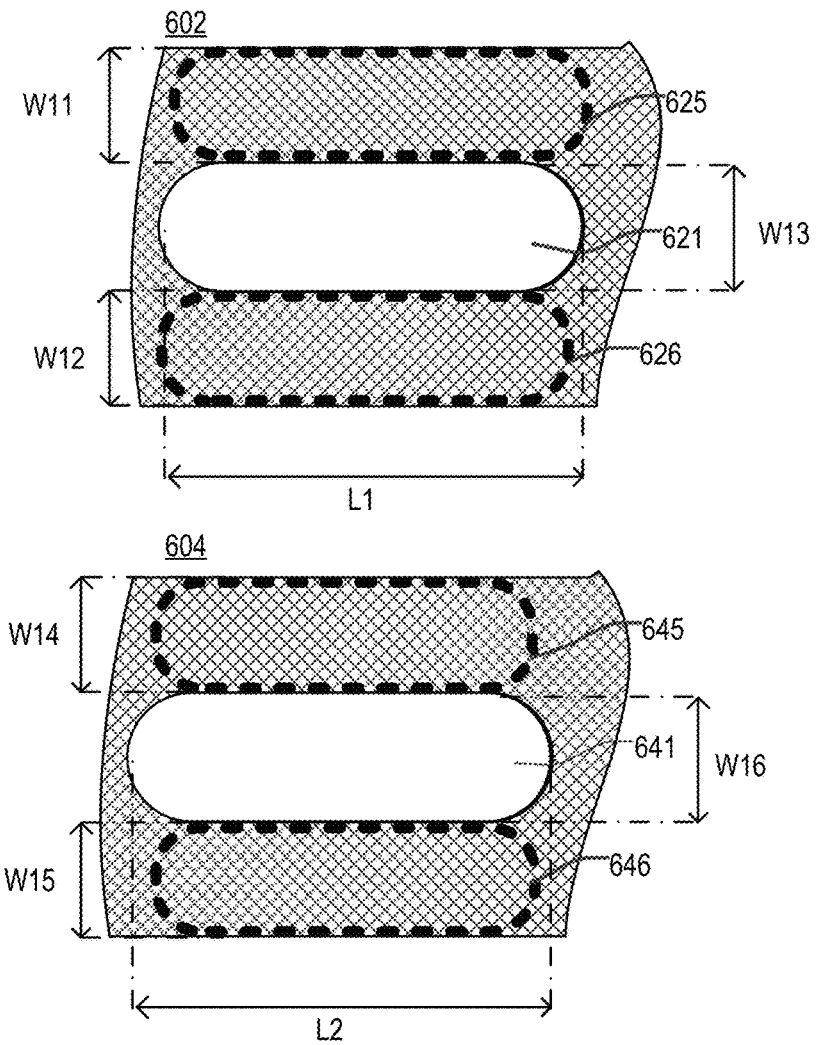
FIG. 6F is a partial top-down view of an example of conductive layers, according to aspects of the disclosure.

FIG. 6F is a partial view of conductive layers 602 and 604. FIG. 6F. illustrates that the through-hole 621 may define legs 625 and 626 of the conductive layer 602. Legs 625 and legs 626 may be disposed on opposite ends of the through-hole 621. Leg 625 may have a width W11, leg 626 may have a width W12, and the through-hole 621 may have a width W13 and a length L1. According to the present example, the width W11 is the same as the width W12. However, alternative implementations are possible in which the width W11 is different from the width W12. FIG. 6F. further illustrates that the through-hole 641 may define legs 645 and 646 of the conductive layer 604. Leg 645 may have a width W14, leg 646 may have a width W15, and the through-hole 641 may have a width W16 and a length L2. According to the present example, the width W14 is the same as the width W15. However, alternative implementations are possible in which the width W14 is different from the width W15. According to the present example, the width W13 is the same as the width W16, however alternative implementations are possible in which they are different. According to the present example, the length L1 is the same as the length L2, however alternative implementations are possible in which they are different. In some implementations, the widths W11-W12 and W14-15 may be equal to 2.6 mm and the widths W13 and W16 may be equal to 0.7 mm. However, the present disclosure is not limited to any specific set of dimensions for the conductor 402 or the individual conductive layers that form the conductor 402.

Figure 6G:
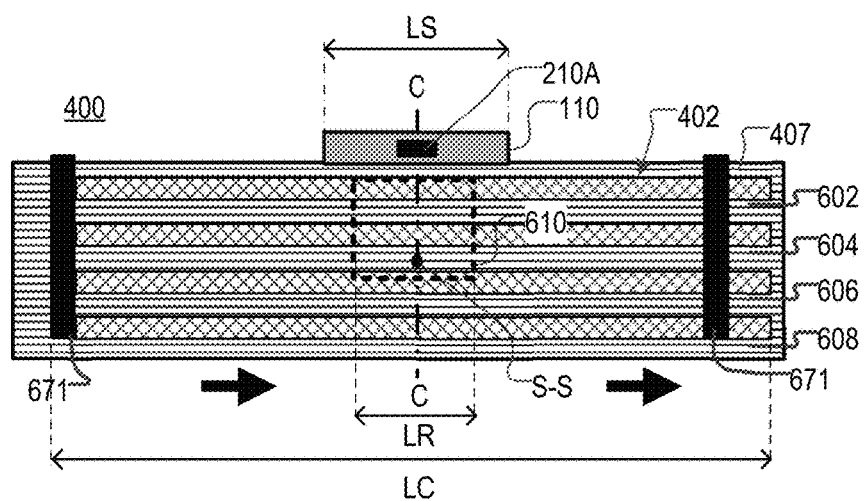
FIG. 6G is a cross-sectional side view of an example of a system, according to aspects of the disclosure.

FIG. 6G is a side view of the system 400, according to aspects of the disclosure. FIG. 6G is provided to illustrate that the conductive layers 602-608 may be electrically coupled to one another by conductive vias 671 to form the conductor 402. FIG. 6G is provided as an example only and the present disclosure is not limited to any specific method for connecting conductive layers to form a single conductor. The flow of current through the conductor 402 is indicated by the black arrows that are positioned underneath the conductor 402 in FIG. 6G. The length LR of the rift 610 may be smaller than the length LS of the packaging of the sensor 110. However, alternative implementations are possible in which the length of the rift 610 is greater than the length LS of the packaging of the sensor 110. The length LR of the rift 610 may be less than or equal to the length LC of the conductor 402.

Figure 6H:
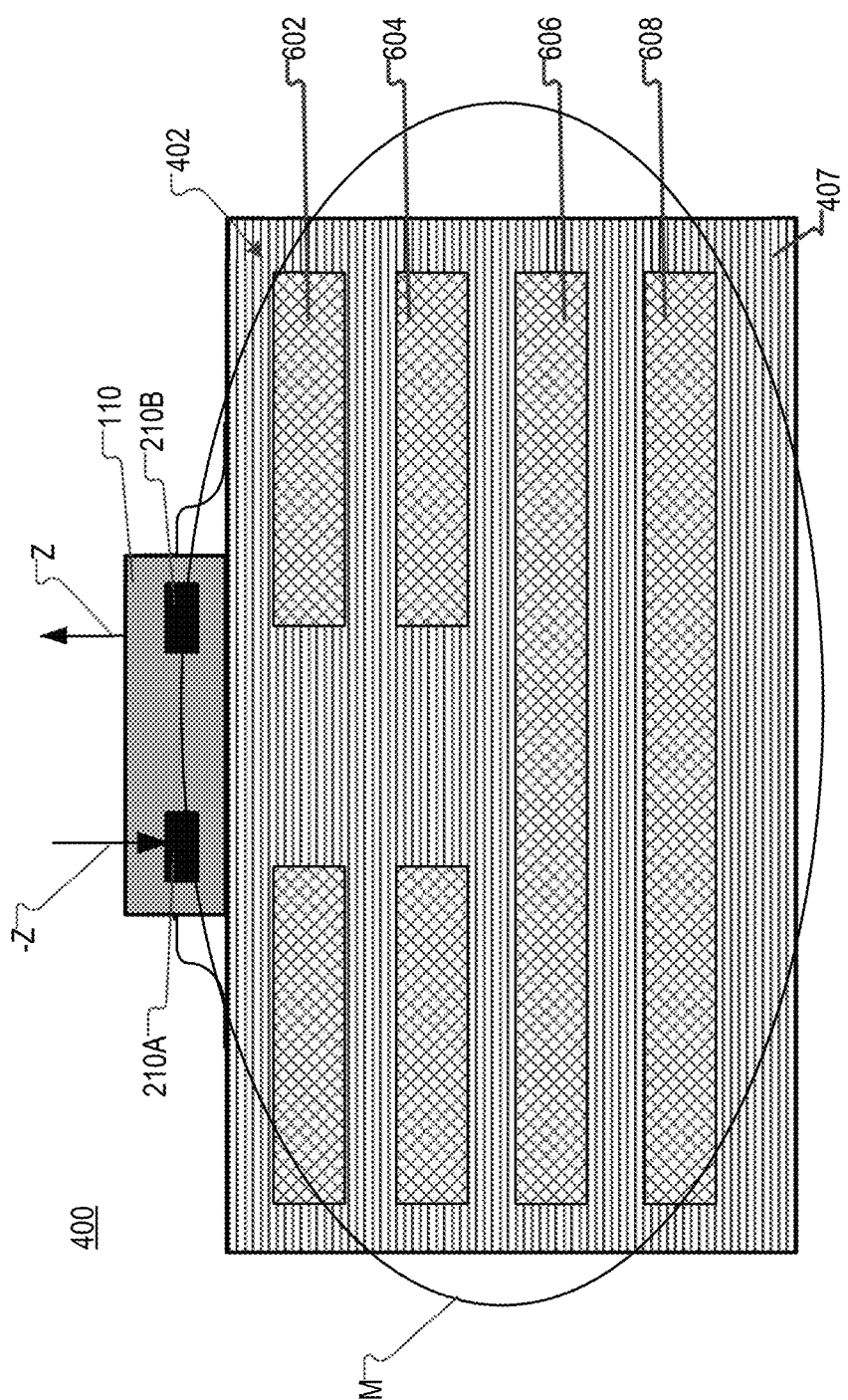
FIG. 6H is a diagram illustrating aspects of the operation of a system, according to aspects of the disclosure.

FIG. 6H is a diagram illustrating aspects of the operation of the current sensor 110. In the example of FIG. 6H, the current sensor 110 is configured to perform coreless sensing of current through the conductor 402. As noted above, the current sensor 110 may be a differential current sensor. The conductor 402 may generate a magnetic field M when current flows through it. Magnetic field sensing elements 210A and 210B may sense components of the magnetic field along the same axis (e.g., the Z-axis). However, the components of the magnetic field M that are sensed by magnetic field sensing elements 210A and 210B may have opposite signs due to the magnetic field M being co-axial with the conductor 402. The output signal that is generated by the current sensor 110 (and which is indicative of the level of current through the conductor 402) may be generated by subtracting the value sensed by the magnetic field sensing element 210A from the value sensed by the magnetic field sensing element 210B. The subtraction may effectively cancel (or reduce the effects of) stray magnetic fields that are incident on the current sensor 110.

Figure 13:
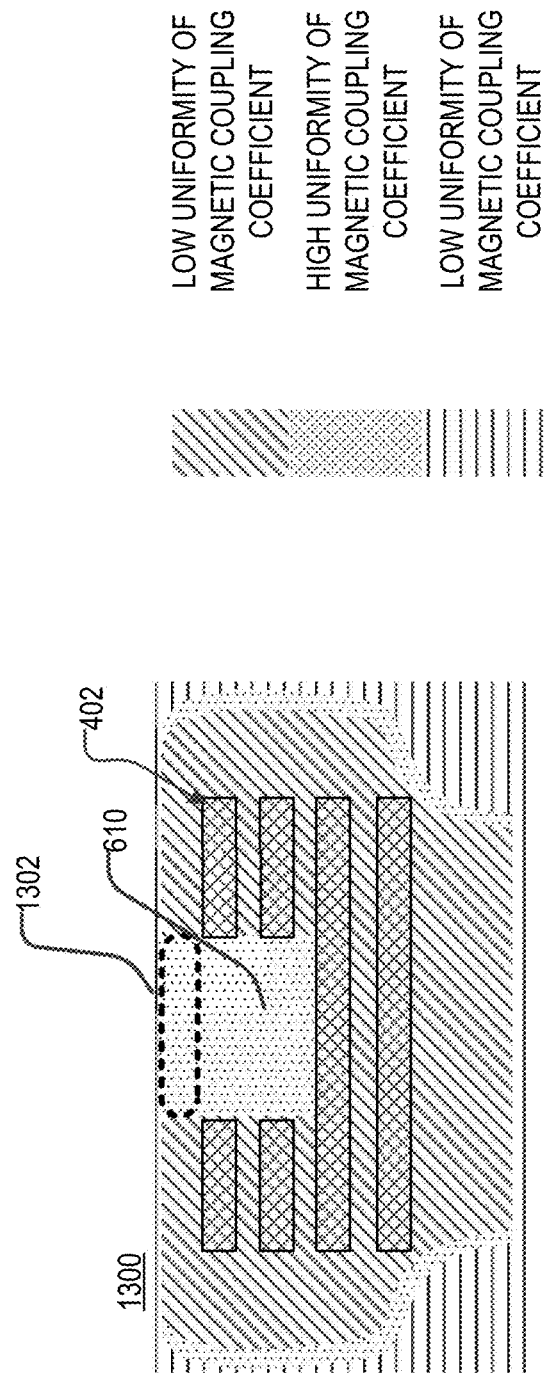
FIG. 13 is a plot illustrating aspects of the operation of a system, according to aspects of the disclosure.

The approach of providing a conductor with a neckdown and placing a current sensor above the neckdown is regarded as working well for increasing the accuracy of current measurements. However, this approach is highly sensitive to placement tolerances or errors in the placement of the current sensor. If the current sensor is placed slightly off-target, the magnetic coupling between the current sensor and neckdown may be compromised. In such circumstances, the benefits from providing the conductor with a neckdown may be reduced or lost altogether. However, according to the present disclosure, it has been determinized that forming a rift in the neckdown, such as the rift 610, could make the magnetic coupling between the current sensor and the conductor less susceptible to manufacturing tolerances and errors in the placement of the current sensor. In particular, the plots discussed further below with respect to FIGS. 12-13 show that providing the conductor with a rift may increase the uniformity of magnetic coupling between the neckdown and the current sensor, resulting in the same (or similar) coupling factor in a plurality of different locations where the sensor could be mounted when manufacturing tolerances and placement errors are taken into consideration. The increased uniformity of the coupling factor may do away with the need for post-manufacturing calibration that is customarily performed in similar systems for the purpose of compensating for deviations in the placement of the current sensor.

As noted above, alternative implementations are possible in which the conductor 402 is not provided with a neckdown. In such implementations, the rift 610 may still be provided in the middle portion 414 of the conductor 610. The provision of the rift 610 may still improve the uniformity of the magnetic coupling between the conductor 402 and the current sensor 110, even though no neckdown is provided in the conductor 402.

A conventional method for reducing the effects of placement errors is to increase the width of the conductor. However, this approach has multiple limitations. For example, this may lead to a significantly reduced coupling factor, reduced signal strength, poor signal-to-noise ratio, increased skin effect, and degraded performance over frequency. In addition, the gains realized from making the conductor wider may reach a plateau where errors from tolerances still remain high. By contrast, the method for reducing the effects of placement errors which involves the formation of a rift in the conductor, and placing the current sensor over the conductor, lacks entirely (or partially) all of these limitations.

Figure 7A:
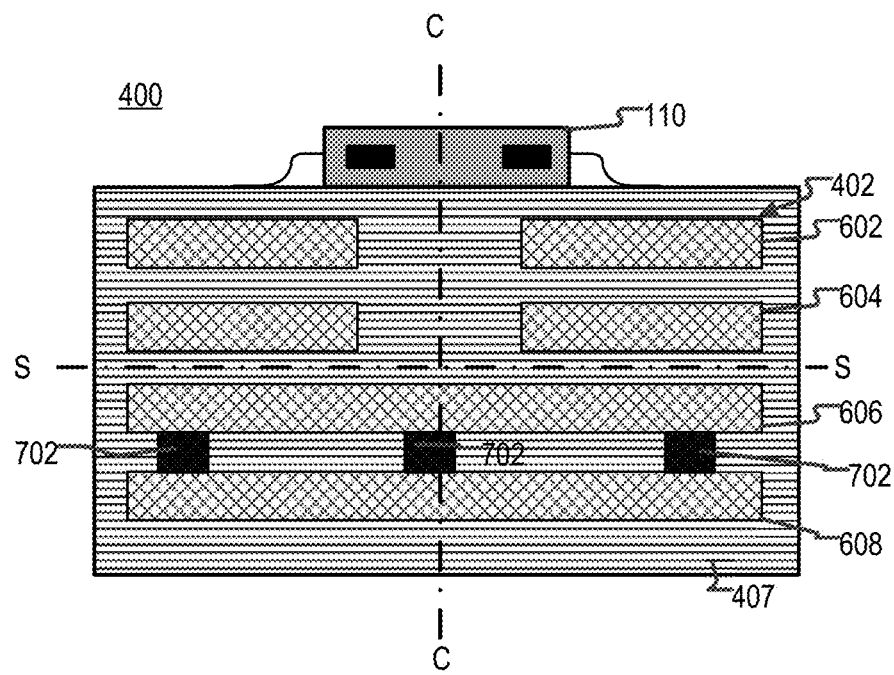
FIG. 7A is a cross-sectional side view of an example of a system, according to aspects of the disclosure.

FIG. 7A shows a cross-sectional side view of the system 400, according to another implementation. In the implementation of FIG. 7A, the conductive layers 608 and 606 are coupled to one another by conductive vias 702. The conductive vias 702 may be formed, at least in part, in the middle portion 414 of the conductor 402.

Figure 7B:
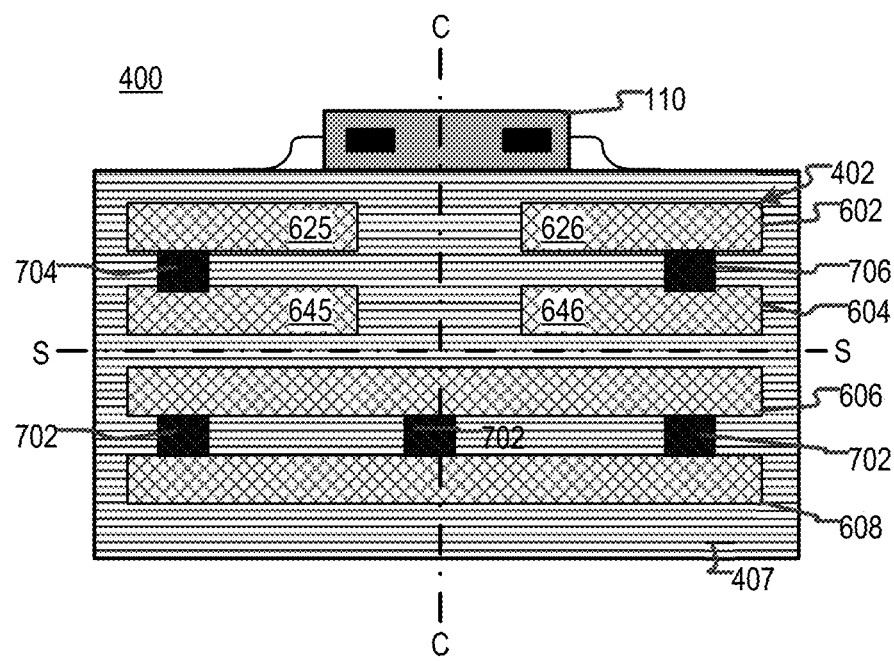
FIG. 7B is a cross-sectional side view of an example of a system, according to aspects of the disclosure.

FIG. 7B shows a cross-sectional side view of the system 400, according to another implementation. In the implementation of FIG. 7B, the conductive layers 608 and 606 are coupled to one another by conductive vias 702 that are formed in the middle portion 414 of the conductor 402. In addition, the conductive layers 602 and 604 are coupled to one another by conductive vias 704 and 706. Conductive vias 704 and 706 may be formed, at least in part, in the middle portion 414 of the conductor 402. Specifically, conductive via 704 may be disposed between (and come in electrical contact with) legs 625 and 645 of conductive layers 602-604 (shown in FIG. 6F) and conductive via 706 may be disposed between (and come in electrical contact with) legs 626 and 646 of conductive layers 602-604 (shown in FIG. 6F).

Figure 8:
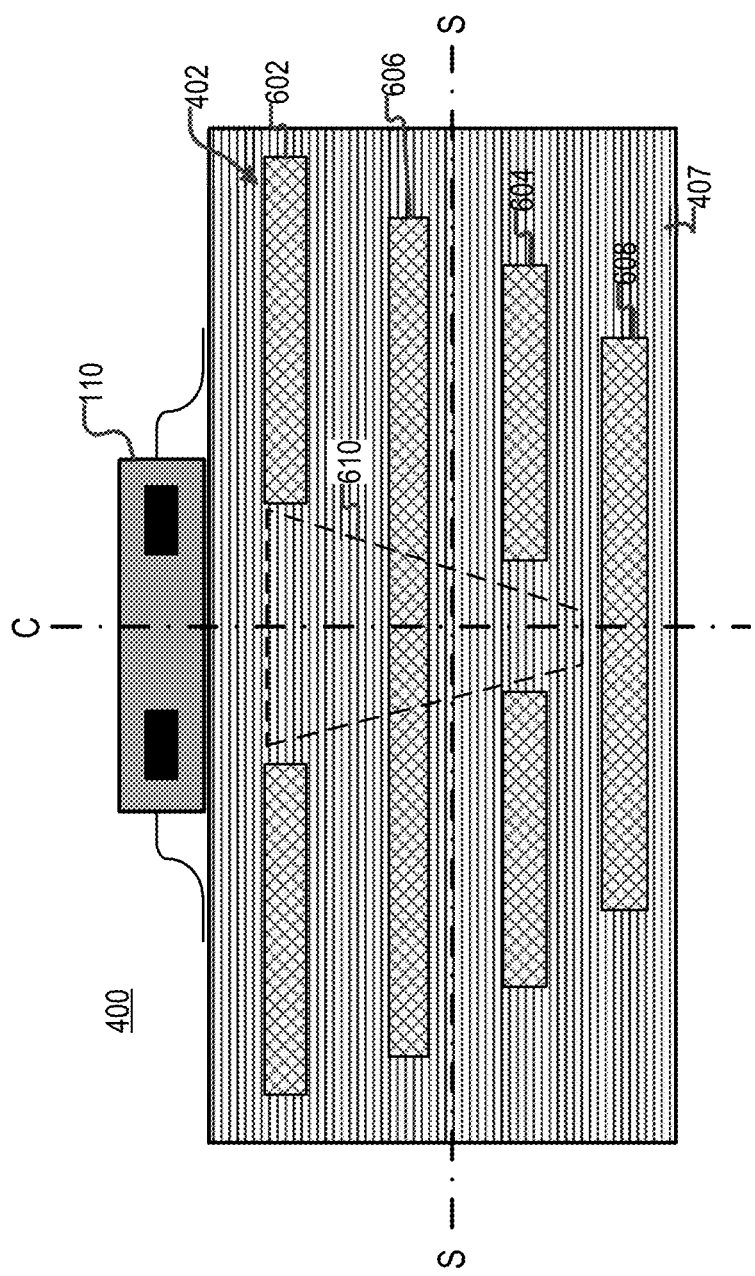
FIG. 8 is a cross-sectional side view of an example of a system, according to aspects of the disclosure.

FIG. 8 shows a cross-sectional view of the system 400, according to another implementation. In this implementation, the conductive layer 606 is disposed between the conductive layers 602 and 604 as shown. In the example of FIG. 8, the width W13 of the through-hole 621 (shown in FIG. 6F) is greater than the width W16 of the through-hole 641 (shown in FIG. 6F). The width W8 of the middle portion 414 of the conductive layer 606 is greater than the widths W6 and W10 of the middle portions 414 of layers 604 and 608. The width W8 of the middle portion 414 of layer 606 is smaller than the width W4 of the middle portion 414 of layer 602. In the example of FIG. 8, layers 604 and 608 may lack a neckdown, while layers 602 and 606 may be provided with a neckdown. In one respect, FIG. 8 shows an example of an implementation of the conductor 402 in which the rift 610 is discontinuous (i.e., intercepted by layer 610).

Figure 9A:
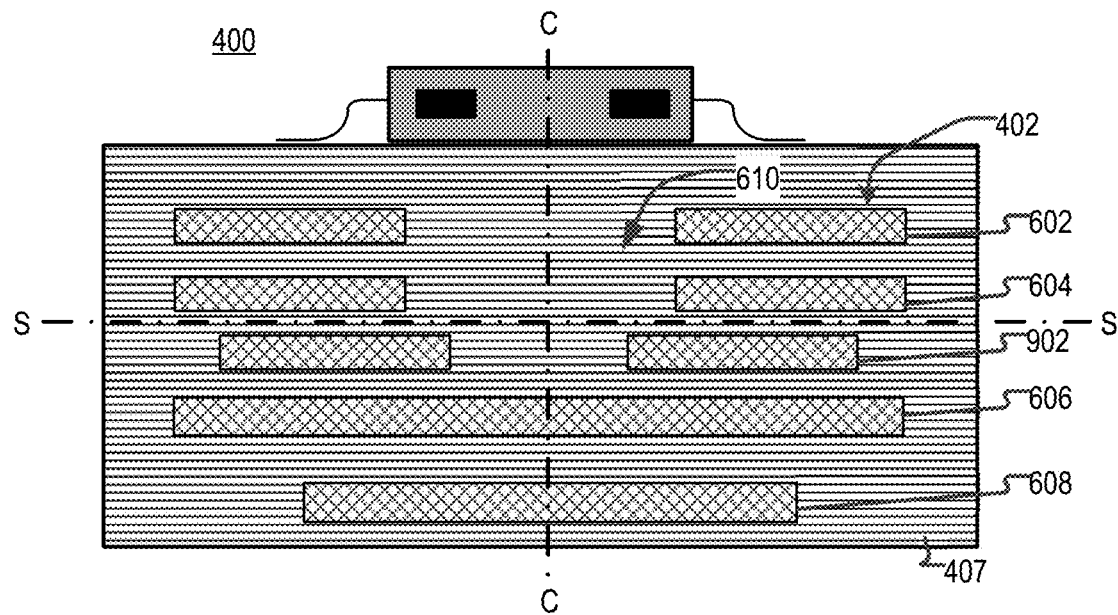
FIG. 9A is a cross-sectional side view of an example of a system, according to aspects of the disclosure.

FIG. 9A shows a cross-sectional view of the system 400, according to another implementation. In the implementation of FIG. 9A, the conductor 402 is provided with a conductive layer 902, which is disposed between conductive layers 604 and 606. The conductive layer 902 may be electrically coupled to conductive layers 602-608, as discussed above with respect to FIG. 6G. The rift 610 may be formed by aligning a through-hole 921 in the layer 902 (shown in FIG. 9B) with through-holes 621 and 641 of layers 602 and 604, respectively.

Figure 9B:
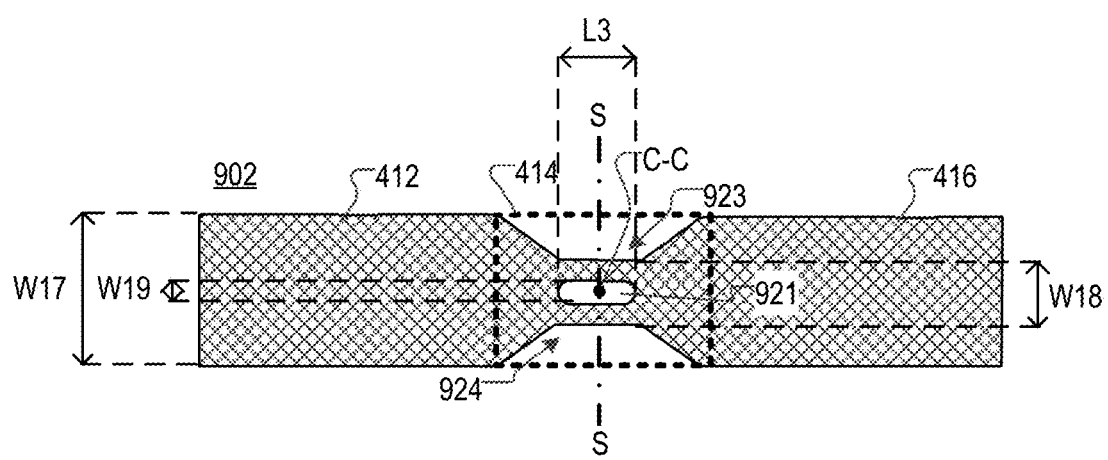
FIG. 9B is a top-down view of an example of a conductive layer, according to aspects of the disclosure.

FIG. 9B shows the conductive layer 902 in further detail. As illustrated, the conductive layer 902 may include side portions 412 and 416, as well as a middle portion 414. The middle portion 414 of the conductive layer 902 is denoted by a dashed rectangle in FIG. 9B. The middle portion 414 of the conductive layer 902 may include a through-hole 921 that is formed therein. In addition, the middle portion 414 of the conductive layer 902 may include notches 923 and 924 that are formed on opposite sides of the through-hole 921. The side portions 412 and 416 of the conductive layer 902 may have a width W17 and the middle portion 414 of the conductive layer 902 may have a width W18, which is smaller than the width W17. The through-hole 921 may have a width W19 and length L3. The width W19 of the through-hole 921 may be smaller than the widths W13 and W16 of through-holes 621 and 641, respectively. The length L3 of the through-hole 921 may be the same or different from the lengths L1 and L2 of through-holes 621 and 641, respectively. The width W18 of the middle portion 414 of layer 902 may be smaller than the widths W4, W6, and W8 of the middle portions 414 of layers 602, 604, and 606, respectively. The width W18 of the middle portion 414 of layer 902 may be larger than the width W10 of the middle portion 414 of layer 608.

Figure 10A:
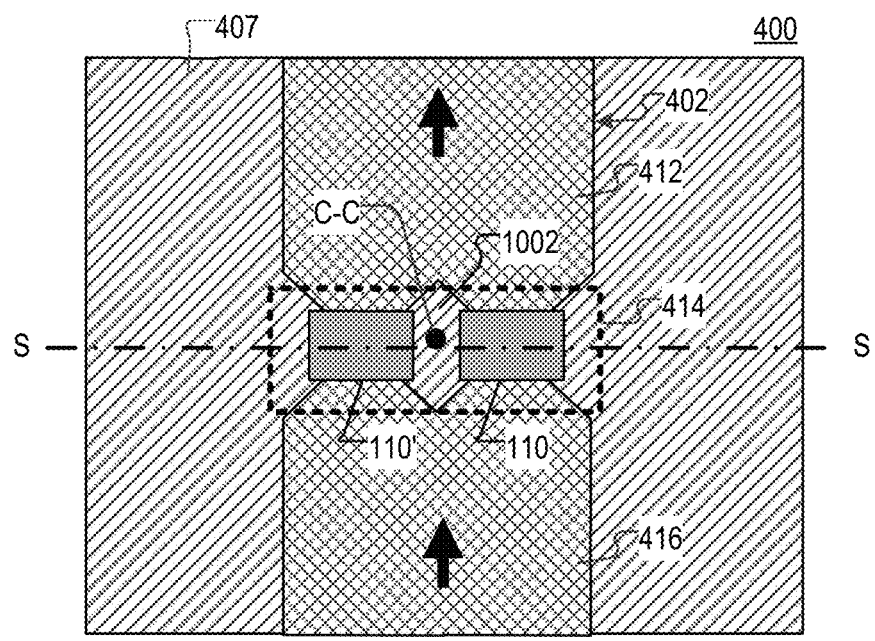
FIG. 10A is a top down view of an example of a system, according to aspects of the disclosure.

FIG. 10A shows another implementation of the system 400, according to aspects of the disclosure. In this implementation, the neckdown of the conductor 402 is doubled, and an additional current sensor 110' is placed over the second neckdown. The two neckdowns, are separated by a cutout 1002. In some implementations, sensors 110 and 110' may be fully redundant, and they may provide identical current measurements. Alternatively, in some implementations, the functions of sensors 110 and 110' may be complementary. In such implementations, the sensor 110 may be arranged to measure current in a first range (e.g., −500 A to +500 A) and the sensor 100' may be arranged to measure current in a second range (e.g., −2000 A to −501 A and +501 A to +2000 A). The sensor 110 may be configured to have a lower error than the sensor 110' for current measurements that fall in the range of −500 A to +500 A. Furthermore, the sensor 110' may be configured to have a lower error (than the sensor 110) for current measurements that fall in the range of −2000 A to −501 A and +501 A to +2000 A. In some respects, when the measurements that are reported by the sensors 110 and 110' indicate that the current through the conductor 402 is in the range of −500 A to +500 A, electronic circuitry that is coupled to the sensors 110 and 110' may choose to use the measurement reported by the sensor 110 over the measurement that is reported by the sensor 110'. Similarly, when the measurements that are reported by the sensors 110 and 110' indicate that the current through the conductor 402 is in the range of −2000 A to −501 A or +501 A to +2000 A, electronic circuitry that is coupled to the sensors 110 and 110' may choose to use the measurement reported by the sensor 110' over the measurement that is reported by the sensor 110 (because the sensor 110' has a lower error in those current ranges). In some implementations, when the sensors 110 and 110' are configured to have different errors in different ranges, the sensors 110 and 110' may be configured and used as discussed in U.S. patent application Ser. No. 17/218,783 titled MULTI-GAIN CHANNELS FOR MULTI-RANGE SENSOR, which is incorporated herein by reference in its entirety. The flow of current through the conductor 402 is indicated by the black arrows that are superimposed on the conductor 402 in FIG. 10A.

Figure 10B:
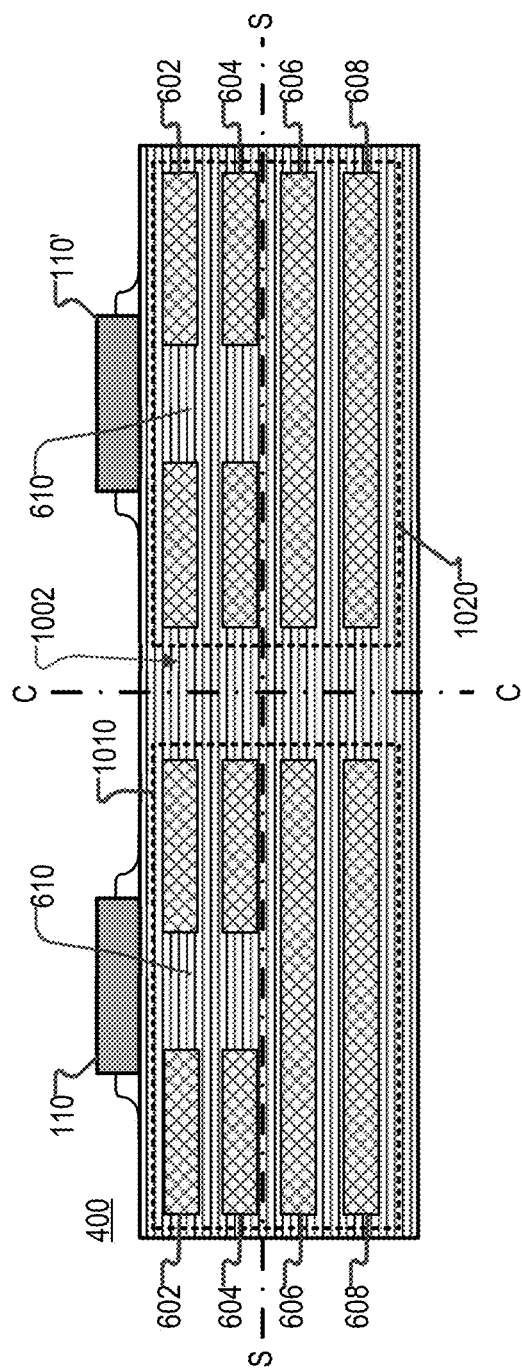
FIG. 10B is a cross-sectional side view of an example of a system, according to aspects of the disclosure.

FIG. 10B is a cross-sectional view of the conductor 402 that is taken along the axis S-S (shown in FIG. 10A). In the example of FIG. 10B, the middle portion 414 of conductor 402 includes sections 1010 and 1020. Each of the sections 1010 and 1020 may be the same or similar to the entire middle portion 414 of the conductor 402 in the implementation that is shown in FIG. 6A. Each of sections 1010 and 1020 may include a respective rift 610. The sensor 110 may be placed over the rift 610 that is formed in section 1010 and the sensor 110' may be placed over the rift 610 that is formed in section 1020. Sections 1010 and 1020 may be separated by the cutout 1002. The cutout 1002 may be filled with dielectric material (e.g., dielectric material that is used to form the PCB 407).

Figure 10C:
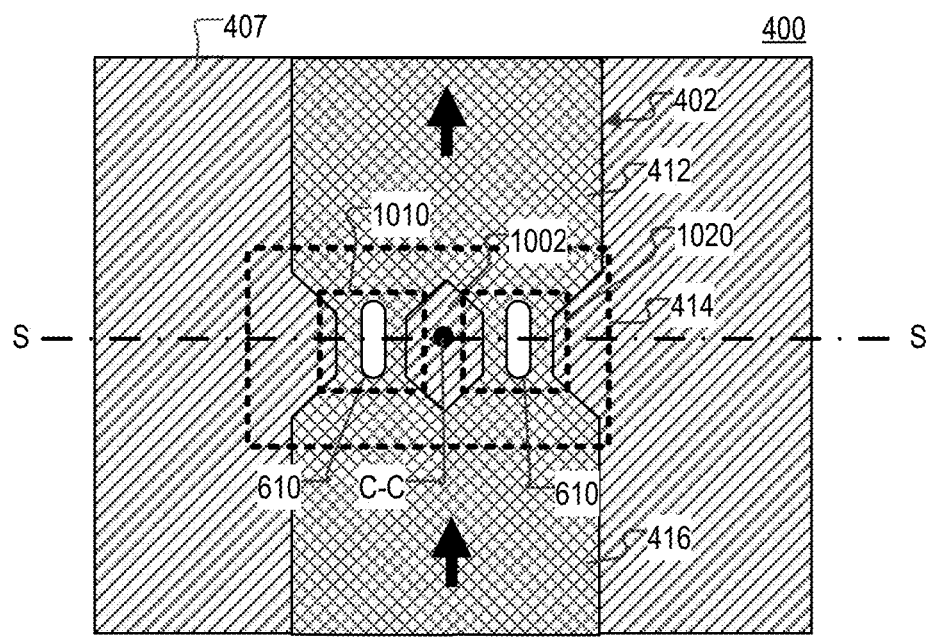
FIG. 10C is a top-down view of a substrate, according to aspects of the disclosure.

FIG. 10C shows another top-down of the system 400, with the sensors 110 and 110' removed. FIG. 10C illustrates that the conductor 402 may be integrated, at least in part, into the PCB 407.

Figure 10D:
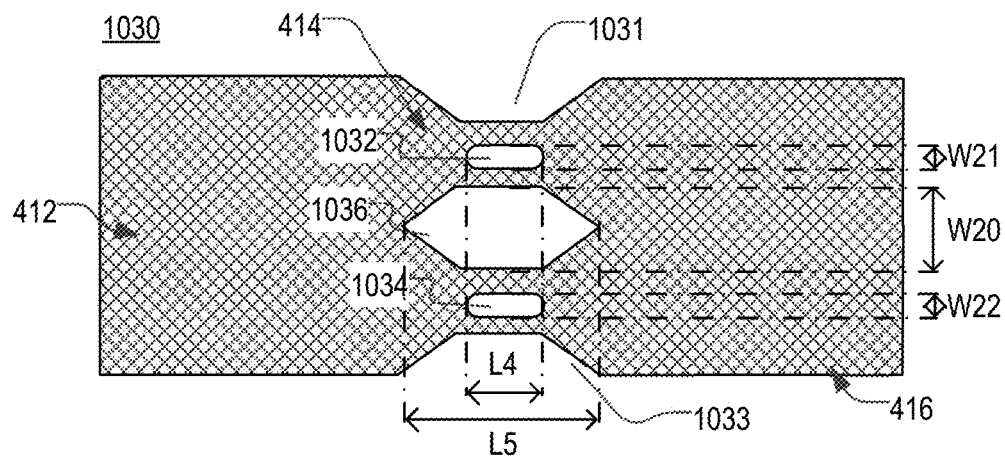
FIG. 10D is a top-down view of an example of a conductive layer, according to aspects of the disclosure.
Figure 10E:
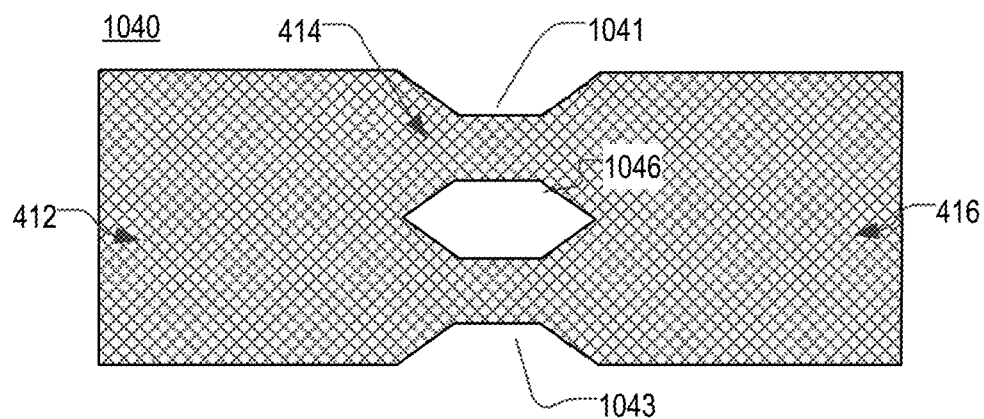
FIG. 10E is a top-down view of an example of a conductive layer, according to aspects of the disclosure.

In the implementation of FIGS. 10A-C, each of the layers 602 and 604 may be the same or similar to the conductive layer 1030, which is shown in FIG. 10D. The layer 1030 may include side portions 412 and 416, and a middle portion 414. The middle portion 414 of the layer 1030 may have through-holes 1032 and 1034 that are formed therein. In addition, the middle portion 414 of the layer 1030 may also include a through-hole 1036. Notches 1031 and 1033 may be formed adjacent to through-holes 1032 and 1034, respectively. In the implementation of FIGS. 10A-C, each of the layers 606 and 608 may be the same or similar to the layer 1040, which is shown in FIG. 10E. The layer 1040 may include side portions 412 and 416, as well as a middle portion 414. The middle portion 414 of the layer 1040 may include a through-hole 1046 and notches 1041 and 1043 may be formed on opposite sides of the through-hole 1046.

In some implementations, the rift 610 in section 1010 may be formed by aligning through-holes that are present in layers 602 and 604 of the conductor 402 (e.g., see through-hole 1032 in FIG. 10D). In some implementations, the rift 610 in section 1020 may be formed by aligning through-holes that are present in layers 602 and 604 of the conductor 402 (e.g., see through-hole 1034 in FIG. 10D). In some implementations, the cutout 1002 may be formed by aligning through-holes that are present in layers 602-608 of the conductor 402 (e.g., see through-holes 1036 and 1046 in FIGS. 10D-E). Accordingly, the rift 610 in each of sections 1010 and 1020 may have a width W21 and a length L4. Although in the present example, the rifts 610 in sections 1010 and 1020 have identical dimensions, alternative implementations are possible in which the rift 610 in section 1010 has a different length and/or width than the rift 610 of section 1020. According to the present example, the cutout 1002 has a width W20 and a length L5. In some implementations, the width W20 may be significantly greater than the width W21 (e.g., at least two times greater, at least three times greater, etc.). In some implementations, the length L5 may be greater than the length L4. The provision of the cutout 1002 between sections 1010 and 1020 may help increase the magnetic coupling factor of sections 1010 and 1020.

FIGS. 11-12 are provided to illustrate advantages resulting from the provision of a rift in the conductor 402. Shown in FIG. 11 is a diagram of a system 1100. The system 1100 includes a current sensor 1110 and a conductor 1112. The conductor 1112 may be embedded in a printed circuit board (PCB) 1107. The conductor 1112 includes a plurality of conductive layers 1114. Each of the conductive layers 1114 may be the same as the conductive layer 608, which is discussed above with respect to FIG. 6E. A sensor 1110 may be mounted over a neckdown of the conductor 1112. Sensor 1110 may be the same or similar to sensor 110, which is discussed above with respect to FIG. 3. The conductor 1112 may be the same or similar to the conductor 402 (shown in FIGS. 4-6A), but for lacking a rift.

Also shown in FIG. 11 is a plot 1120. Plot 1120 includes a curve 1122 and a curve 1124. Curve 1122 shows the variation of the magnetic coupling factor between the conductor 1112 and the sensor 1110 along the X-axis of a coordinate system 1126. Curve 1122 shows the value of the magnetic coupling factor as a function of the width of the neckdown portion of the conductor 1112. Curve 1124 shows the variation of the magnetic coupling factor between the conductor 1112 and the sensor 1110 along the Z-axis of the coordinate system 1126. Curve 1124 shows the value of the magnetic coupling factor as a function of the width of the neckdown portion of the conductor 1112. Together, curves 1122 and 1124 show that the variation of the coupling factor along the Z-axis is much greater than the variation along the X-axis. In the plot 1120, the coupling factor variation over misplacement is expressed in percent of the nominal coupling factor per misplacement of 100 micrometers (when the sensor is at an ideal position)

FIG. 12 shows a plot 1220. Plot 1220 includes a curve 1222 and a curve 1224. Curve 1222 shows the variation of the magnetic coupling factor between the conductor 402 and the sensor 110 along the X-axis of a coordinate system 1226. Curve 1222 shows the value of the magnetic coupling factor as a function of the width of the neckdown of the conductor 402. Curve 1224 shows the variation of the magnetic coupling factor between the conductor 402 and the sensor 110 along the Z-axis of the coordinate system 1226. Curve 1224 shows the value of the magnetic coupling factor as a function of the width of the neckdown of the conductor 402.

FIG. 12, together with FIG. 11, shows that the provision of a rift in the conductor 402 results in an overall lowering of coupling factor variations along the Z-axis. In some manufacturing contexts, the coupling factor between the sensor and the conductor varies more along the Z-axis than the X and Y axes, which makes the Z-axis the dominant source of variations. Reducing the variations of the coupling factor along the Z-axis is advantageous because it results in the reduction of errors in the measurements taken by sensing elements 210A-B that need to be compensated by end-of-line calibration.

Moreover, FIG. 12 further illustrates that the provision of a rift in the conductor 402 results in a lowering of the discrepancy between the variations along the X-axis and the Z-axis, with the variations along both axes being substantially the same for neckdown widths in the range of 4.5-5.5 mm. According to the present disclosure, it has been determined that the provision of a rift in the conductor 402 can bring down the variation of the coupling factor to 0.5%/100 um without further optimization. It must be noted that the length (along the Y-axis) of the conductor 402 is assumed to be above 6 mm, but smaller or larger lengths are also possible to be used. In some implementations, the length (along the Y-axis) of the conductor 402 may need to be at least 0.5 mm (to provide at least partial placement immunity).

FIG. 13 shows a heatmap 1300, which illustrates the degree of uniformity exhibited by the magnetic coupling factor of the conductor 402. The heatmap 1300 illustrates that the magnetic coupling factor exhibits a high level of uniformity in the rift 610 and the area 1302 directly above the rift 610, where the sensor 110 is mounted. As noted above, the increased uniformity of the coupling factor may do away with the need for post-manufacturing calibration that is customarily performed in similar systems for the purpose of compensating for deviations in the placement of the current sensor.

FIG. 14 shows a plot 1402 of the variation of the magnetic coupling factor of the conductor 402 as a function of the frequency of the electrical current that is carried by the conductor 402. Plot 1402 illustrates that the provision of the rift 610 in the conductor 402 does not significantly affect the frequency-performance of the conductor 402. Specifically, plot 1402 illustrates that the magnetic coupling factor of the conductor 402 remains substantially uniform for signals having a frequency below 1 KHz. FIG. 14 further shows a plot 1404 that illustrates the phase shift caused by the conductor 402 as a function of the frequency of the current that is carried by the conductor 402. Plot 1404 illustrates that the provision of the rift 610 in the conductor 402 does not significantly affect the phase-performance of the conductor 402. Specifically, plot 1404 illustrates that no substantial phase shift of the current is caused by the conductor 402 (or rift 610) for frequencies under 1 KHz.

Figure 15:
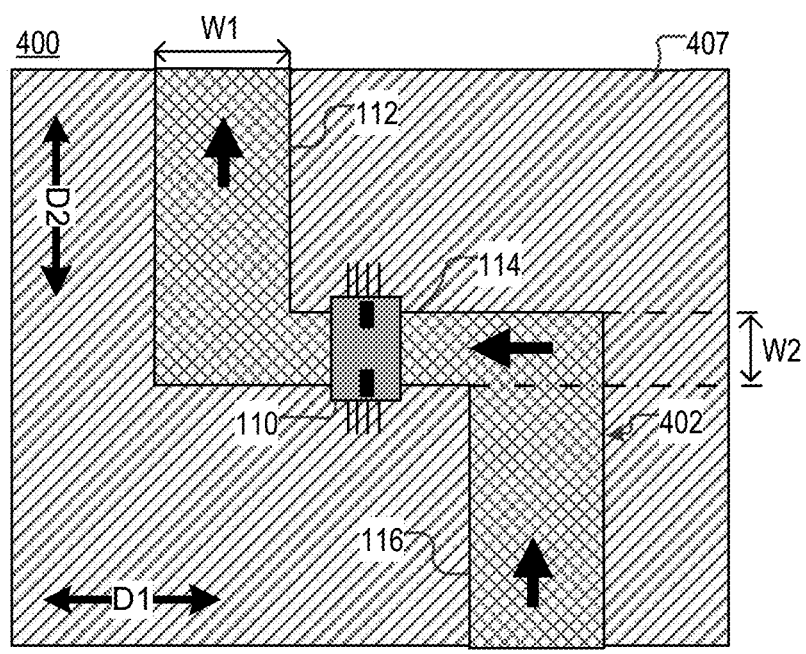
FIG. 15 is a top-down view of an example of a system, according to aspects of the disclosure.

FIG. 15 is a planar top-down view of the system 400, according to another implementation. In the example of FIG. 15, the conductor 402 is Z-shaped. As a result of this arrangement, the middle portion 414 of the conductor 402 extends in a direction D1 and the side portions 112 and 116 of the conductor 402 extend in direction D2. Although in the present example the middle portion 114 of the conductor 402 is oriented at an angle relative to both of side portions 112 and 116, alternative implementations are possible in which the middle portion 114 of the conductor 402 is oriented at an angle relative to only one of the side portions 112 and 116 of the conductor 402. In some respects, orienting the middle portion 114 of the conductor 402 at an angle relative to the side portions 412 and 416 is advantageous because it may reduce (or ideally eliminate) the effects of stray magnetic fields originating from neighboring conductors, thus reducing (or ideally eliminating) cross-talk with the neighboring conductors.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., an addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A substrate, comprising:
one or more first conductive layers;
one or more second conductive layers that are electrically coupled to the first conductive layers, the first conductive layers and the second conductive layers being arranged to form a conductor, the first conductive layers being arranged to define a first rift in the conductor; and
a dielectric material that is arranged to encapsulate, at least in part, the first conductive layers and the second conductive layers,
wherein the first rift is arranged to cause an area directly above the first rift to have a substantially uniform magnetic coupling coefficient.

2. The substrate of claim 1, wherein the one or more first conductive layers include a plurality of first conductive layers.

3. The substrate of claim 1, wherein the one or more second conductive layers are disposed below the one or more first conductive layers.

4. The substrate of claim 1, wherein the conductor includes a middle portion that is disposed between two side portions, the middle portion of the conductor has a smaller width than the side portions of the conductor, and the first rift is formed in the middle portion of the conductor.

5. The substrate of claim 1, wherein each of the first conductive layers includes a respective through-hole that is arranged to define, at least in part, the first rift in the conductor.

6. The substrate, of claim 1, wherein each of the first conductive layers includes at least two segments that are spaced apart from each other and arranged to define, at least in part, the first rift.

7. A substrate, comprising:
one or more first conductive layers;
one or more second conductive layers that are electrically coupled to the first conductive layers, the first conductive layers and the second conductive layers being arranged to form a conductor, the first conductive layers being arranged to define a first rift in the conductor; and
a dielectric material that is arranged to encapsulate, at least in part, the first conductive layers and the second conductive layers,
wherein the one or more first conductive layers include at least two first conductive layers, and at least one of the second conductive layers is disposed between the first conductive layers, dividing the first rift into two portions.

8. A substrate, comprising:
one or more first conductive layers;
one or more second conductive layers that are electrically coupled to the first conductive layers, the first conductive layers and the second conductive layers being arranged to form a conductor, the first conductive layers being arranged to define a first rift in the conductor; and
a dielectric material that is arranged to encapsulate, at least in part, the first conductive layers and the second conductive layers,
wherein the conductor includes a middle portion that is disposed between side portions, the side portions and the middle portion each having a respective central axis, such that the respective central axis of the middle portion is transverse to the respective central axes of the side portions.

9. A substrate, comprising:
one or more first conductive layers;
one or more second conductive layers that are electrically coupled to the first conductive layers, the first conductive layers and the second conductive layers being arranged to form a conductor, the first conductive layers being arranged to define a first rift in the conductor; and
a dielectric material that is arranged to encapsulate, at least in part, the first conductive layers and the second conductive layers,
wherein the conductor includes: a first portion having the first rift formed therein, a second portion having a second rift formed therein, and a cutout that is formed between the first portion and the second portion.

10. A system, comprising:
one or more first conductive layers;
one or more second conductive layers that are electrically coupled to the first conductive layers, the first conductive layers and the second conductive layers being arranged to form a conductor, the first conductive layers being configured to define a first rift in the conductor; and
a first current sensor that is mounted above the first rift, wherein the first rift is arranged to cause an area where the first current sensor is mounted to have a substantially uniform magnetic coupling coefficient.

11. The system of claim 10, further comprising a dielectric material that is configured to encapsulate, at least in part, the one or more first conductive layers and the one or more second conductive layers, wherein the one or more first conductive layers include a plurality of first conductive layers.

12. The system of claim 10, wherein the one or more second conductive layers are disposed below the one or more first conductive layers.

13. The system of claim 10, wherein the conductor includes a middle portion that is disposed between two side portions, the middle portion of the conductor having a smaller width than the side portions of the conductor, and the first rift is formed in the middle portion of the conductor.

14. The system of claim 10, wherein each of the first conductive layers includes a respective through-hole that is arranged to define, at least in part, the first rift in the conductor.

15. The system of claim 10, wherein each of the first conductive layers includes at least two segments that are spaced apart from each other and arranged to define, at least in part, the first rift.

16. A system, comprising:
one or more first conductive layers;
one or more second conductive layers that are electrically coupled to the first conductive layers, the first conductive layers and the second conductive layers being arranged to form a conductor, the first conductive layers being configured to define a first rift in the conductor; and a first current sensor that is mounted above the first rift, wherein the one or more first conductive layers include at least two first conductive layers, and at least one of the second conductive layers is disposed between the first conductive layers, dividing the first rift into two portions.

17. A system, comprising:
one or more first conductive layers;
one or more second conductive layers that are electrically coupled to the first conductive layers, the first conductive layers and the second conductive layers being arranged to form a conductor, the first conductive layers being configured to define a first rift in the conductor; and
a first current sensor that is mounted about the first rift, wherein the conductor includes a middle portion that is disposed between side portions, the side portions and the middle portion each having a respective central axis, such that the respective central axis of the middle portion is transverse to the respective central axes of the side portions.

18. A system, comprising:
one or more first conductive layers,
one or more second conductive layers that are electrically coupled to the first conductive layers, the first conductive layers and the second conductive layers being arranged to form a conductor, the first conductive layers being configured to define a first rift in the conductor; and
a first current sensor that is mounted about the first rift, wherein the conductor includes a first portion having the first rift formed therein, and a second portion having a second rift formed therein, and a cutout that is formed between the first portion and the second portion, the system further comprising a second current sensor that is mounted over the second rift.

19. A substrate, comprising:
a plurality of conductors, each of the plurality of conductors including one or more first conductive layers and one or more second conductive layers that are electrically coupled to the first conductive layers, the first conductive layers in any of the plurality of conductors being configured to define a respective rift in the conductor; and
a dielectric material that is arranged to encapsulate, at least in part, the plurality of conductors,
wherein the respective rift in any of the plurality of conductors is arranged to cause an area directly above the respective rift to have a substantially uniform magnetic coupling coefficient.

20. The substrate of claim 19, wherein:
each of the plurality of conductors includes a respective middle portion that is disposed between respective side portions, the respective middle portion of any of the plurality of conductors having a smaller width than the respective side portions of that conductor; and the respective rift in any of the plurality of conductors is formed in that conductor's respective middle portion.

21. The substrate of claim 19, wherein each of the plurality of conductors includes a respective middle portion that is disposed between respective side portions, the respective side portions and the respective middle portion each having a respective central axis, such that the central axis of the respective middle portion is transverse to the central axes of the respective side portions.

22. The substrate of claim 19, wherein each of the first conductive layers in any given one of the plurality of conductors includes a respective through-hole that is arranged to define, at least in part, the respective rift in the given conductor.

23. The substrate, of claim 19, wherein each of the first conductive layers in any given one of the plurality of conductors includes a pair of segments that are arranged to define, at least in part, the respective rift in the given conductor.

24. A system, comprising:
a plurality of conductors, each of the plurality of conductors including one or more first conductive layers and one or more second conductive layers that are electrically coupled to the first conductive layers, the first conductive layers in any of the plurality of conductors being configured to define a respective rift in the conductor; and
a plurality of current sensors, wherein each of the current sensors is disposed over the respective rift in a different one of the plurality of conductors,
wherein the respective rift in any of the plurality of conductors is arranged to cause an area over the respective rift to have a substantially uniform magnetic coupling coefficient.

25. The system of claim 24, wherein:
each of the plurality of conductors includes a respective middle portion that is disposed between respective side portions, the respective middle portion of any of the plurality of conductors having a smaller width than the respective side portions of that conductor; and
the respective rift in any of the plurality of conductors is formed in that conductor's respective middle portion.

26. The system of claim 24, wherein each of the plurality of conductors includes a respective middle portion that is disposed between respective side portions, the respective side portions and the respective middle portion each having a respective central axis, such that the central axis of the respective middle portion is transverse to the central axes of the respective side portions.

27. The system of claim 24, wherein each of the first conductive layers in any given one of the plurality of conductors includes a respective through-hole that is arranged to define, at least in part, the respective rift in the given conductor.

28. The system of claim 24, wherein each of the first conductive layers in any given one of the plurality of conductors includes a pair of segments that are arranged to define, at least in part, the respective rift in the given conductor.

* * * * *

UNITED STATES PATENT AND TRADEMARK OFFICE
CERTIFICATE OF CORRECTION

PATENT NO. : 11,940,470 B2
APPLICATION NO. : 17/804654
DATED : March 26, 2024
INVENTOR(S) : Loïc André Messier et al.

It is certified that error appears in the above-identified patent and that said Letters Patent is hereby corrected as shown below:

In the Specification

Column 1, Line 7 delete "or magnetic" and replace with --or more magnetic--.

Column 4, Line 58 delete "301, a VOUT" and replace with --301, and a VOUT--.

Column 6, Line 21 delete "conductance" and replace with --conductive--.

Column 7, Line 35 delete "FIGS. 4-6B," and replace with --FIGS. 4-6E--.

Column 7, Line 43 delete "FIGS. 4-6B," and replace with --FIGS. 4-6E--.

Column 7, Line 67 delete "FIG. 6B" and replace with --FIG. 6A--.

Column 8, Line 4 delete ", etc.)" and replace with --, etc.).--.

Column 9, Line 35 delete "conductor 610." and replace with --conductor 402--.

Column 10, Line 22 delete "intercepted by layer 610)." and replace with --interrupted by layer 606).--.

Column 11, Line 1 delete "100" and replace with --110'--.

Column 12, Line 56 delete "position" and replace with --position).--.

Column 13, Line 58 delete "portion 414" and replace with --portion 114--.

Column 14, Line 1 delete "412 and 416" and replace with --112 and 116--.

Signed and Sealed this
Third Day of December, 2024

Katherine Kelly Vidal
*Director of the United States Patent and Trademark Office*